US012574051B2

(12) United States Patent
Leblanc

(10) Patent No.: US 12,574,051 B2
(45) Date of Patent: Mar. 10, 2026

(54) METHOD AND SYSTEM FOR OPTIMIZING TRANSMISSION OF SERIALIZED DATA USING DYNAMIC, ADAPTIVE SLICING AND REDUCTION OF SERIALIZED DATA

(71) Applicant: Alpha Sanatorium Technologies Inc., Laval (CA)

(72) Inventor: Steeve Leblanc, Laval (CA)

(73) Assignee: ALPHA SANATORIUM TECHNOLOGIES INC., Laval (CA)

( * ) Notice: Subject to any disclaimer, the term of this patent is extended or adjusted under 35 U.S.C. 154(b) by 123 days.

(21) Appl. No.: 18/709,456

(22) PCT Filed: Nov. 9, 2022

(86) PCT No.: PCT/IB2022/060798
§ 371 (c)(1),
(2) Date: May 10, 2024

(87) PCT Pub. No.: WO2023/084418
PCT Pub. Date: May 19, 2023

(65) Prior Publication Data
US 2025/0038766 A1 Jan. 30, 2025

Related U.S. Application Data

(60) Provisional application No. 63/264,005, filed on Nov. 12, 2021.

(51) Int. Cl.
*H03M 7/00* (2006.01)
*H03M 7/30* (2006.01)
*H04L 69/04* (2022.01)
(52) U.S. Cl.
CPC ........... *H03M 7/55* (2013.01); *H03M 7/3059* (2013.01); *H03M 7/6011* (2013.01); *H04L 69/04* (2013.01)

(58) Field of Classification Search
USPC ...................................................... 341/50, 51
See application file for complete search history.

(56) References Cited

U.S. PATENT DOCUMENTS 8,120,516 B2 * 2/2012 Archbold ................ H03M 7/30
341/51
10,263,933 B2 * 4/2019 Judd ....................... H04L 51/18
(Continued)

FOREIGN PATENT DOCUMENTS

CN 104780222 A 7/2015
CN 110399415 A 11/2019
(Continued)

OTHER PUBLICATIONS

International Search Report and Written Opinion issued in International Application No. PCT/IB2022/060798, mailed Jun. 5, 2023.
(Continued)

*Primary Examiner* — Jean B Jeanglaude
(74) *Attorney, Agent, or Firm* — ARENTFOX SCHIFF LLP

(57) ABSTRACT

There is provided a system and a method for dynamically and adaptively slicing, reducing and bit packing a streamed serialized data sequence. A streamed serialized data sequence is received, and a reduction matrix is iteratively applied on the streamed serialized data sequence to obtain a plurality of sliced values. For a given iteration, it is determined if a corresponding given sliced value of the plurality of sliced values is present in an index. If the given sliced value is not present, the given sliced value is added by bit packing an unused id associated with the given sliced value using a first number of bits based on a current index length and using a second number of bits to encode the sliced data value to thereby obtain a given bit packed sliced value. The (Continued)

given bit packed sliced value is aggregated to obtain a bit packed data stream and transmitted.

22 Claims, 11 Drawing Sheets

(56)                    References Cited

U.S. PATENT DOCUMENTS

| | | | |
|---|---|---|---|
| 10,956,415 B2* | 3/2021 | Pal ...................... | G06F 16/2471 |
| 2010/0033357 A1* | 2/2010 | Archbold ............... | H03M 7/30 |
| | | | 341/106 |
| 2020/0410030 A1 | 12/2020 | Bai et al. | |
| 2021/0242880 A1* | 8/2021 | Ovsiannikov ....... | G06F 9/30145 |

FOREIGN PATENT DOCUMENTS

| | | | |
|---|---|---|---|
| CN | 112463706 A | 3/2021 | |
| JP | 2013257767 A | 12/2013 | |

OTHER PUBLICATIONS

Nicola Jones, "How to stop data centres from gobbling up to the world's electricity", News Feature, Sep. 12, 2018, Correction Sep. 13, 2018, pp. 1-13.

\* cited by examiner

510

514 518

520

524

Figure 8:
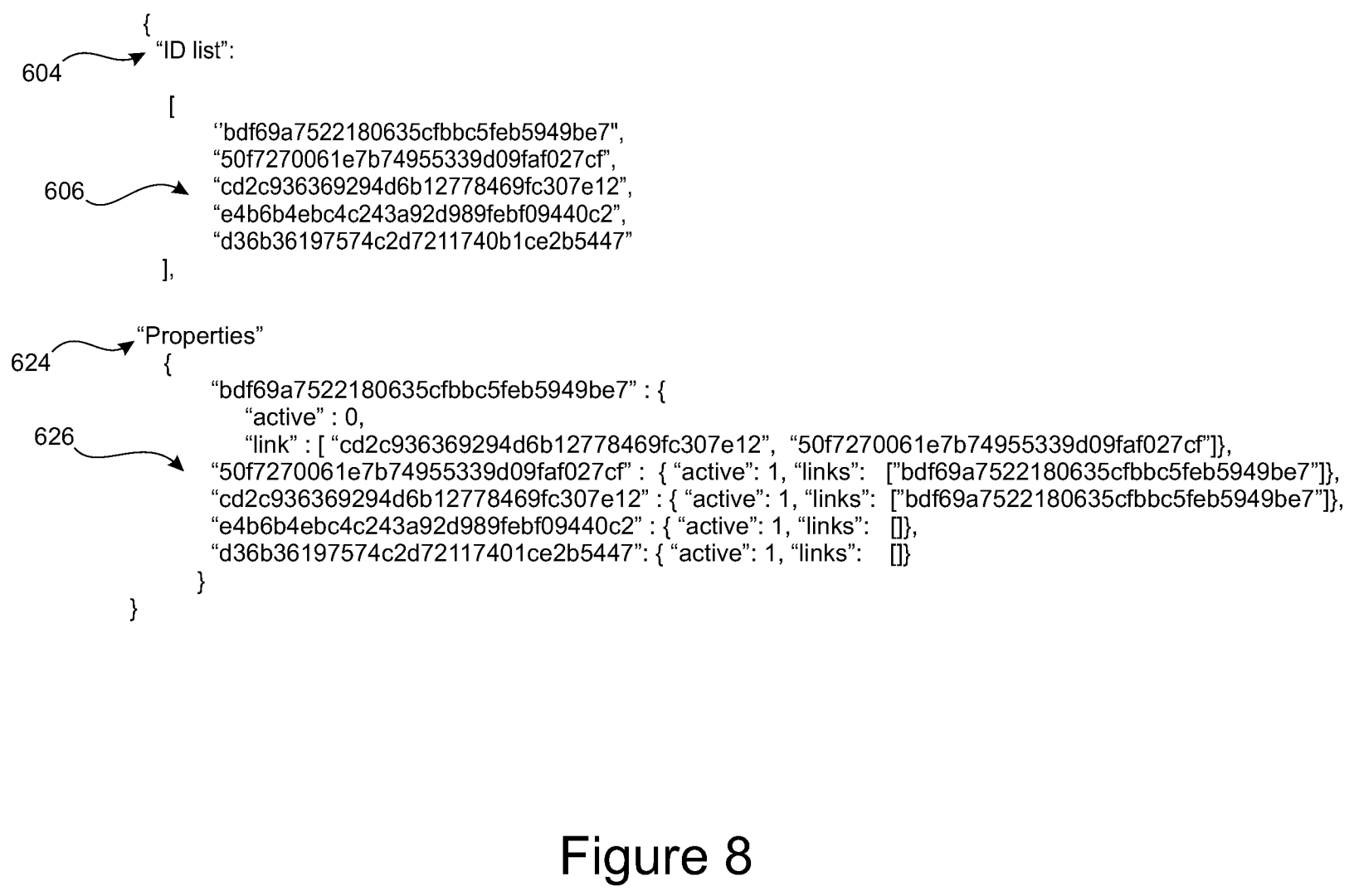

{
"ID list":
  [
    "bdf69a752218063 5cfbbc5feb5949be7",
    "50f7270061e7b74955339d09faf027cf",
    "cd2c93636929 4d6b12778469fc307e12",
    "e4b6b4ebc4c243a92d989febf09440c2",
    "d36b3619757 4c2d7211740b1ce2b5447"
  ],
"Properties"
  {
    "bdf69a752218063 5cfbbc5feb5949be7" : {
      "active" : 0,
      "link" : [ "cd2c93636929 4d6b12778469fc307e12",
        "50f7270061e7b74955339d09faf027cf",
        "cd2c93636929 4d6b12778469fc307e12" : { "active": 1, "links":  ["bdf69a752218063 5cfbbc5feb5949be7"]},
        "e4b6b4ebc4c243a92d989febf09440c2" : { "active": 1, "links": ["bdf69a752218063 5cfbbc5feb5949be7"]},
        "d36b3619757 4c2d7211740 1ce2b5447": { "active": 1, "links": []},
        "50f7270061e7b74955339d09faf027cf"]}, { "active": 1, "links": []}
    }
  }
}

METHOD AND SYSTEM FOR OPTIMIZING TRANSMISSION OF SERIALIZED DATA USING DYNAMIC, ADAPTIVE SLICING AND REDUCTION OF SERIALIZED DATA

CROSS-REFERENCE TO RELATED APPLICATIONS

This is a national stage application based on International Patent Application No. PCT/IB2022/060798, filed Nov. 9, 2022, which claims priority to U.S. Provisional Patent Application Ser. No. 63/264,005 filed on Nov. 12, 2021, the disclosures of each of which are incorporated herein by reference in their entireties.

FIELD

The present technology relates to data processing and data transmission and more specifically to methods and systems for optimizing data transmission by using dynamic and adaptive slicing and compression of serialized data, which may be used in the context of cloud computing networks for example.

BACKGROUND

Cloud computing platforms provide web services and application programming interfaces (APIs) to individuals, companies and governments on a metered pay-as-you-go-basis. The sheer amount of data that is transmitted over such platforms and the growing use and wide adoption of such systems render prediction of traffic and budgeting difficult for clients, while such systems may suffer from security issues and may be vulnerable to cyber-attacks (e.g., denial-of-service (DoS) attacks).

One of the only available solutions to render such systems more efficient is a complete reengineering of the aforementioned platforms. However, it is a difficult task due to the required expertise, the risk of introducing errors and defects, notwithstanding interoperability and support issues. Further, this reengineering would require converting existing technologies and paradigms natively supported by present applications, which are self-descriptive and human understandable (e.g., JavaScript Object Notation (JSON), Extensible Markup Language (XML), HyperText Markup Language (HTML)) to binary formats that are not human understandable.

In addition to the financial costs, the large volume of data exchanged has a direct impact on the amount of electricity required by the data center due to sheer size of storage required which causes data to be fragmented and spread out to a growing number of processing units. The impact on electricity consumption has a non-negligible effect on the environment, specifically in regions where electricity is generated using fossil fuels.

For example, in the article by Jones, Nicola "How to stop data centres from gobbling up the world's electricity." in *Nature* vol. 561, 7722 (2018): 163-166. doi:10.1038/d41586-018-06610-y, it is estimated that data-centre electricity use is likely to increase about 15-fold by 2030, to 8% of projected global demand, and while solutions such as hyperscale centers and innovative cooling techniques enable reducing electricity consumption, physical barriers that limits the function of transistors will be reached just in a few decades, which may limit the improvements that can be made in further reducing consumption.

SUMMARY

It is an object of the present technology to ameliorate at least some of the inconveniences present in the prior art. One or more embodiments of the present technology may provide and/or broaden the scope of approaches to and/or methods of achieving the aims and objects of the present technology.

One or more embodiments of the present technology have been developed based on developers' appreciation that redundancy of elements in serialized data structures of outbound network traffic (egress) could be used to optimize data transmission. For example, Representational State Transfer (REST) web application programming interfaces (APIs) that provide microservices use specific types of data objects with similar structures and contain limited textual values. Developers have appreciated that such objects types, structures and values may be represented in the form of an index.

One or more embodiments of the present technology enable reducing the size of transmitted digital objects without losing the information, thereby reducing bandwidth and electricity consumption and thus costs associated therewith.

The present technology does not require a complete reengineering or redesign of cloud systems (as opposed to what current solutions propose) as it may be applied on the transmission channel only in a non-transitory manner (e.g., during a current session), thus minimizing the above-mentioned drawbacks. Further, one or more embodiments of the present technology may be adapted and used between components of or with: a computing device, a router, NVMe disk drivers, an IoT devices a Docker or Kubernetes container, a mobile app service, a NoSQL database engine, a cloud service, etc.

Thus, one or more embodiments of the present technology are directed to a method of and a system for optimizing data transmission by using dynamic and adaptive slicing and reduction of serialized data.

One or more embodiments of the present technology use a mutable and polymorphic data reduction matrix to slice and reduce, in an adaptative and dynamic manner, a streamed serialized data sequence, which is bit packed and transmitted in an outgoing bit packed data stream. The serialized data sequence may be reconstituted by the same or another device using the reverse process on the bit packed data stream, and does not require storage and maintenance of large indexes or dictionaries after the end of the session (i.e., end of the data stream or interruption).

One or more embodiments of the data reduction and compacting methods and systems of the present technology may be understood as methods and systems for performing transcoding of serialized data streams.

The present technology may operate on any type of serialized data format, such as, but not limited to, Javascript Object Notation (JSON), XML, YAML Ain't Markup Language (YAML), Protocol Buffers/Flat Buffers, BSON, AVRO, MessagePack Multipurpose Internet Mail Extensions (MIME) as well as on non-compiled code in JavaScript, Python, Perl, VBScript, bash, Powershell, Groovy, Lua, R, PostScript, PUP, AppleScript, etc.

The present technology is not bound to specific physical transmission channels and may be adapted to future data transmission networks with higher bandwidths.

One or more embodiments of the present technology use bit arrays (also known as bit map, bit set, bit string, or bit vector) as an array data structure to compactly store bits. One or more embodiments of the present technology enable slicing serialized data according to serialization data standards and reduce and pack the data using a varying number of bits that is unaligned to bytes (i.e., 8 bits), without passing their length, thus reducing overall size.

One or more embodiments of the present technology may use additional data compression techniques (also known as bit rate reduction techniques) to encode information using fewer bits than the original representation.

Non-limiting examples of entropy type lossless compression techniques include: Arithmetic, Asymmetric numeral systems, Golomb, Huffman (Adaptive, Canonical, Modified), Range, Shannon, Shannon-Fano, Shannon-Fano-Elias, Tunstall, Unary, and Universal (Exp-Golomb, Fibonacci, Gamma, Levenshtein).

Non-limiting examples of dictionary type lossless compression techniques include: byte pair encoding and Lempel-Ziv (842, Broth, Deflate, LZ4, LZFSE, LZJB, LZMA, LZO, LZRW, LZS, LZSS, LZW, LZWL, LZX, Snappy, and Zstandard)

Non-limiting examples of other types of lossless compression techniques include: BWT, CTW, Delta, DMC, DPCM, LDCT, MTF, PAQ, PPM, RLE.

In accordance with a broad aspect of the present technology, there is provided a method for dynamically and adaptively reducing a streamed serialized data sequence to obtain a bit packed data stream, the method being executed by at least one processor. The method comprises: receiving a streamed serialized data sequence comprising a plurality of serialized data objects each having a serialized object data type, iteratively applying a reduction matrix on the streamed serialized data sequence to obtain a plurality of sliced values based at least on the serialized object data types, said iteratively applying comprising: initializing an index, and for a given iteration: determining if a corresponding given sliced value of the plurality of sliced values is present in an index, if the given sliced value is not present in the index: adding the given sliced value to the index, the adding comprising: bit packing an unused id associated with the given sliced value using a first number of bits based on a current index length and using a second number of bits to encode the sliced data value to thereby obtain a given bit packed sliced value, aggregating a plurality of bit packed sliced values to obtain a bit packed data stream, the plurality of bit packed sliced values comprising the given bit packed sliced value, and transmitting the bit packed data stream, the bit packed data stream comprising an indication of the index and the given sliced value.

In one or more embodiments of the method, the method further comprises, prior to said aggregating the plurality of bit packed sliced values to obtain the bit data packed data sequence: if the given sliced value is present in the index: referencing the given sliced value, the referencing comprises: bit packing the given sliced value using a third number of bits representing a reference id to obtain the given bit packed sliced value.

In one or more embodiments of the method, said iteratively applying the reduction matrix on the streamed serialized data sequence to obtain the plurality of sliced values comprises: obtaining a given sliced object, determining a respective index context based on one of: a position, and a key associated with the given sliced object, and passing the one of a position and the key as the sliced value.

In one or more embodiments of the method, said passing the key as the sliced value comprises passing a sequence of characters representing the key as the sliced value.

In one or more embodiments of the method, said iteratively applying the reduction matrix on the streamed serialized data sequence to obtain the plurality of sliced values comprises: determining a current respective index context, the current respective index context being based at least on a format of the streamed serialized data sequence.

In one or more embodiments of the method, the method further comprises: if the index is empty for the current respective index context, defaulting the id to zero.

In one or more embodiments of the method, said iteratively applying the reduction matrix on the streamed serialized data sequence to obtain the plurality of sliced values comprises: iteratively applying the reduction matrix on the sliced object to obtain another given sliced value, the another given sliced value being associated with a current respective index context.

In one or more embodiments of the method, said iteratively applying the reduction matrix on the streamed serialized data sequence to obtain the plurality of sliced values further comprises obtaining a given sliced control, the given sliced control not being associated with a value in the streamed serialized data sequence.

In one or more embodiments of the method, the given sliced control is not indexed and is associated with a respective id.

In one or more embodiments of the method, the given sliced control is processed using an overflow technique.

In one or more embodiments of the method, the given sliced control is indicative of a delimitation of a portion of the streamed serialized data sequence.

In one or more embodiments of the method, the reference id comprises control metadata, the control metadata comprises one of: a solo, and an offset to a last index id.

In one or more embodiments of the method, the method further comprises encoding handling operations metadata based on a predetermined table, the predetermined table comprises, for each respective data type and each respective control: a respective index offset to the last id.

In one or more embodiments of the method, the predetermined table comprises, for each respective data type and each respective control, a solo control on an empty index.

In one or more embodiments of the method, said iteratively applying the reduction matrix on the streamed serialized data sequence to obtain the plurality of sliced values comprises: obtaining a given sliced array, and iteratively applying the reduction matrix on the streamed serialized data sequence to obtain a further sliced value.

In one or more embodiments of the method, the method further comprises, after said obtaining the given sliced array: determining, based on the given sliced array, a respective index context.

In one or more embodiments of the method, said iteratively applying the reduction matrix on the streamed serialized data sequence to obtain the plurality of sliced values comprises: iteratively applying the reduction matrix on the sliced array to obtain a further given sliced value.

In one or more embodiments of the method, the index is represented using one of: HashMaps, vectors, and arrays.

In one or more embodiments of the method, the streamed serialized data sequence comprises a plurality of serialized data blocks.

In one or more embodiments of the method, the reduction matrix comprises a set of conditions associated with each data type in the streamed serialized data sequence for generating each of the sliced value, the sliced array and the sliced control.

In one or more embodiments of the method, the reduction matrix is stored in a non-transitory storage medium operatively connected to the processor.

In one or more embodiments of the method, said aggregating the plurality of bit packed sliced values to obtain the bit packed data stream comprises: aggregating the given packed sliced value with another set of packed sliced values to obtain the plurality of bit packed sliced values.

In one or more embodiments of the method, the given sliced control comprises one of: an object delimitation, an array delimitation and a string delimitation.

In one or more embodiments of the method, the respective index context comprises one of: a default index context, a sliced array context, and a key index context.

In one or more embodiments of the method, the streamed serialized data sequence comprises a JavaScript Object Notation (JSON) data sequence.

In one or more embodiments of the method, the given sliced value is associated with metadata.

In one or more embodiments of the method, the reduction matrix is implemented as a mutable reduction matrix.

In accordance with a broad aspect of the present technology, there is provided a system for dynamically and adaptively reducing a serialized data sequence to obtain a bit packed data stream. the system comprises: at least one processor, and a non-transitory storage medium operatively connected to the at least one processor, the non-transitory storage medium comprises computer-readable instructions, the at least one processor, upon executing the computer-readable instructions, being configured for: receiving a streamed serialized data sequence comprising a plurality of serialized data objects each having a serialized object data type, iteratively applying a reduction matrix on the streamed serialized data sequence to obtain a plurality of sliced values based at least on the serialized object data types, said iteratively applying comprising: initializing an index, and for a given iteration: determining if a corresponding given sliced value of the plurality of sliced values is present in an index, if the given sliced value is not present in the index: adding the given sliced value to the index, the adding comprising: bit packing an unused id associated with the given sliced value using a first number of bits based on a current index length and using a second number of bits to encode the sliced data value to thereby obtain a given bit packed sliced value, aggregating a plurality of bit packed sliced values to obtain a bit packed data stream, the plurality of bit packed sliced values comprising the given bit packed sliced value, and transmitting the bit packed data stream, the bit packed data stream comprising an indication of the index and the given sliced value.

In one or more embodiments of the system, the at least one processor is further configured for, prior to said aggregating the plurality of bit packed sliced values to obtain the bit data packed data sequence: if the given sliced value is present in the index: referencing the given sliced value, the referencing comprises: bit packing the given sliced value using a third number of bits representing a reference id to obtain the given bit packed sliced value.

In one or more embodiments of the system, said iteratively applying the reduction matrix on the streamed serialized data sequence to obtain the plurality of sliced values comprises: obtaining a given sliced object, determining a respective index context based on one of: a key and a position associated with the given sliced object, and passing the one of the key and the position as the sliced value.

In one or more embodiments of the system, said passing the key as the sliced value comprises passing a sequence of characters representing the key as the sliced value.

In one or more embodiments of the system, said iteratively applying the reduction matrix on the streamed serialized data sequence to obtain the plurality of sliced values comprises: determining a current respective index context, the current respective index context being based at least on a format of the streamed serialized data sequence.

In one or more embodiments of the system, the at least one processor is further configured for: if the index is empty for the current respective index context, defaulting the id to zero.

In one or more embodiments of the system, said iteratively applying the reduction matrix on the streamed serialized data sequence to obtain the plurality of sliced values comprises: iteratively applying the reduction matrix on the sliced object to obtain another given sliced value, the another given sliced value being associated with a current respective index context.

In one or more embodiments of the system, said iteratively applying the reduction matrix on the streamed serialized data sequence to obtain the plurality of sliced values further comprises obtaining a given sliced control, the given sliced control not being associated with a value in the streamed serialized data sequence.

In one or more embodiments of the system, the given sliced control is not indexed and is associated with a respective id.

In one or more embodiments of the system, the given sliced control is processed using an overflow technique.

In one or more embodiments of the system, the given sliced control is indicative of a delimitation of a portion of the streamed serialized data sequence.

In one or more embodiments of the system, the reference id comprises control metadata, the control metadata comprises one of: a solo, and an offset to a last index id.

In one or more embodiments of the system, the at least one processor is further configured for encoding handling operations metadata based on a predetermined table, the predetermined table comprises, for each respective data type and each respective control: a respective index offset to the last id.

In one or more embodiments of the system, the predetermined table comprises, for each respective data type and each respective control, a solo control on an empty index.

In one or more embodiments of the system, said iteratively applying the reduction matrix on the streamed serialized data sequence to obtain the plurality of sliced values comprises: obtaining a given sliced array, and iteratively applying the reduction matrix on the streamed serialized data sequence to obtain a further sliced value.

In one or more embodiments of the system, the at least one processor is further configured for, after said obtaining the given sliced array: determining, based on the given sliced array, a respective index context.

In one or more embodiments of the system, said iteratively applying the reduction matrix on the streamed serialized data sequence to obtain the plurality of sliced values comprises: iteratively applying the reduction matrix on the sliced array to obtain a further given sliced value.

In one or more embodiments of the system, the index is represented using one of: HashMaps, vectors, and arrays.

In one or more embodiments of the system, the streamed serialized data sequence comprises a plurality of serialized data blocks.

In one or more embodiments of the system, the reduction matrix comprises a set of conditions associated with each data type in the streamed serialized data sequence for generating each of the sliced value, the sliced array and the sliced control.

In one or more embodiments of the system, the reduction matrix is stored in a non-transitory storage medium operatively connected to the processor.

In one or more embodiments of the system, said aggregating the plurality of bit packed sliced values to obtain the bit packed data stream comprises: aggregating the given packed sliced value with another set of packed sliced values to obtain the plurality of bit packed sliced values In one or more embodiments of the system, the given sliced control comprises one of: an object delimitation, an array delimitation and a string delimitation.

In one or more embodiments of the system, the respective index context comprises one of: a default index context, a sliced array context, and a key index context.

In one or more embodiments of the system, the streamed serialized data sequence comprises a JavaScript Object Notation (JSON) data sequence.

In one or more embodiments of the system, the given sliced value is associated with metadata.

In one or more embodiments of the system, the reduction matrix is implemented as a mutable reduction matrix.

Terms and Definitions

In the context of the present specification, a "server" is a computer program that is running on appropriate hardware and is capable of receiving requests (e.g., from electronic devices) over a network (e.g., a communication network), and carrying out those requests, or causing those requests to be carried out. The hardware may be one physical computer or one physical computer system, but neither is required to be the case with respect to the present technology. In the present context, the use of the expression a "server" is not intended to mean that every task (e.g., received instructions or requests) or any particular task will have been received, carried out, or caused to be carried out, by the same server (i.e., the same software and/or hardware); it is intended to mean that any number of software elements or hardware devices may be involved in receiving/sending, carrying out or causing to be carried out any task or request, or the consequences of any task or request; and all of this software and hardware may be one server or multiple servers, both of which are included within the expressions "at least one server" and "a server".

In the context of the present specification, "electronic device" is any computing apparatus or computer hardware that is capable of running software appropriate to the relevant task at hand. Thus, some (non-limiting) examples of electronic devices include general purpose personal computers (desktops, laptops, netbooks, etc.), mobile computing devices, smartphones, and tablets, Internet of Things (IoT) devices (e.g., smart speakers, smart appliances, smart home devices, sensors, etc.), and network equipment such as routers, switches, and gateways. It should be noted that an electronic device in the present context is not precluded from acting as a server to other electronic devices. The use of the expression "an electronic device" does not preclude multiple electronic devices being used in receiving/sending, carrying out or causing to be carried out any task or request, or the consequences of any task or request, or steps of any method described herein. In the context of the present specification, a "client device" refers to any of a range of end-user client electronic devices, associated with a user, such as personal computers, tablets, smartphones, and the like.

In the context of the present specification, the expression "computer readable storage medium" (also referred to as "storage medium" and "storage") is intended to include non-transitory media of any nature and kind whatsoever, including without limitation RAM, ROM, disks (CD-ROMs, DVDs, floppy disks, hard drivers, etc.), USB keys, solid state-drives, tape drives, etc. A plurality of components may be combined to form the computer information storage media, including two or more media components of a same type and/or two or more media components of different types.

In the context of the present specification, a "database" is any structured collection of data, irrespective of its particular structure, the database management software, or the computer hardware on which the data is stored, implemented or otherwise rendered available for use. A database may reside on the same hardware as the process that stores or makes use of the information stored in the database or it may reside on separate hardware, such as a dedicated server or plurality of servers.

In the context of the present specification, the expression "information" includes information of any nature or kind whatsoever capable of being stored in a database. Thus information includes, but is not limited to audiovisual works (images, movies, sound records, presentations etc.), data (location data, numerical data, etc.), text (opinions, comments, questions, messages, etc.), documents, spreadsheets, lists of words, etc.

In the context of the present specification, unless expressly provided otherwise, an "indication" of an information element may be the information element itself or a pointer, reference, link, or other indirect mechanism enabling the recipient of the indication to locate a network, memory, database, or other computer-readable medium location from which the information element may be retrieved. For example, an indication of a document could include the document itself (i.e. its contents), or it could be a unique document descriptor identifying a file with respect to a particular file system, or some other means of directing the recipient of the indication to a network location, memory address, database table, or other location where the file may be accessed. As one skilled in the art would recognize, the degree of precision required in such an indication depends on the extent of any prior understanding about the interpretation to be given to information being exchanged as between the sender and the recipient of the indication. For example, if it is understood prior to a communication between a sender and a recipient that an indication of an information element will take the form of a database key for an entry in a particular table of a predetermined database containing the information element, then the sending of the database key is all that is required to effectively convey the information element to the recipient, even though the information element itself was not transmitted as between the sender and the recipient of the indication.

In the context of the present specification, the expression "communication network" is intended to include a telecommunications network such as, but not limited to, a computer network, the Internet, a telephone network, a Telex network, a TCP/IP data network (e.g., a WAN network, a LAN network, etc.), virtual Networks (e.g., VLAN, VNET, VXLAN, CNI, etc.) and the like. The term "communication network" includes a wired network or direct-wired connection (e.g. twisted pairs, coaxial cables, fiber optics, etc.), and wireless media such as acoustic, radio frequency (RF), optical wireless communications (OMC) (e.g. visible, infrared, ultraviolet light) and other wireless media, as well as combinations of any of the above.

In the context of the present specification, the words "first", "second", "third", etc. have been used as adjectives only for the purpose of allowing for distinction between the nouns that they modify from one another, and not for the purpose of describing any particular relationship between those nouns. Thus, for example, it should be understood that, the use of the terms "first server" and "third server" is not intended to imply any particular order, type, chronology, hierarchy or ranking (for example) of/between the server, nor is their use (by itself) intended imply that any "second server" must necessarily exist in any given situation. Further, as is discussed herein in other contexts, reference to a "first" element and a "second" element does not preclude the two elements from being the same actual real-world element. Thus, for example, in some instances, a "first" server and a "second" server may be the same software and/or hardware, in other cases they may be different software and/or hardware.

Implementations of the present technology each have at least one of the above-mentioned object and/or aspects, but do not necessarily have all of them. It should be understood that some aspects of the present technology that have resulted from attempting to attain the above-mentioned object may not satisfy this object and/or may satisfy other objects not specifically recited herein.

Additional and/or alternative features, aspects and advantages of implementations of the present technology will become apparent from the following description, the accompanying drawings and the appended claims.

BRIEF DESCRIPTION OF THE DRAWINGS

For a better understanding of the present technology, as well as other aspects and further features thereof, reference is made to the following description which is to be used in conjunction with the accompanying drawings, where:

FIG. 8 illustrates a non-limiting examples of a JSON object and its structure.

DETAILED DESCRIPTION

Figure 1:
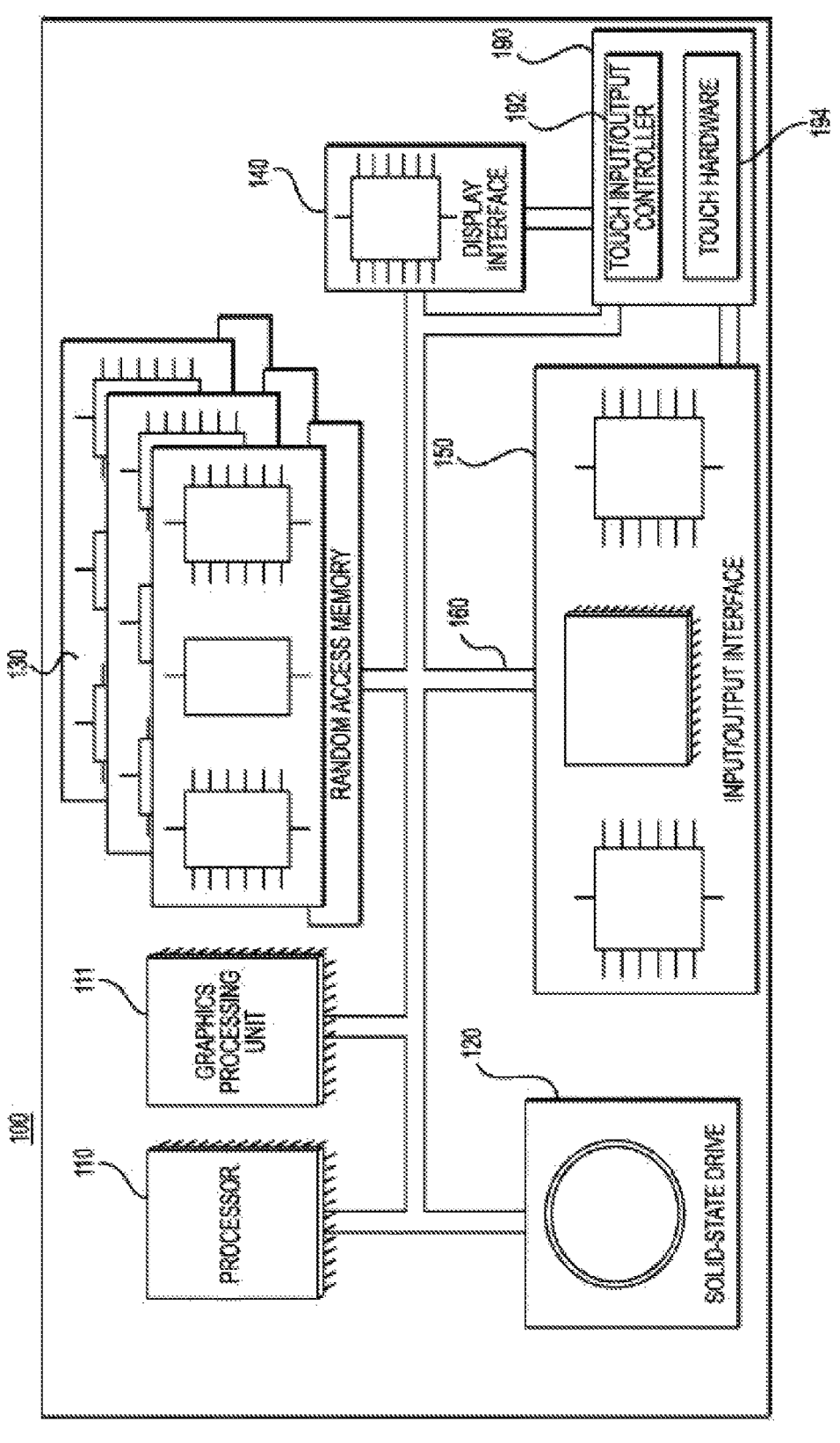
FIG. 1 depicts a schematic diagram of an electronic device in accordance with one or more non-limiting embodiments of the present technology.

The examples and conditional language recited herein are principally intended to aid the reader in understanding the principles of the present technology and not to limit its scope to such specifically recited examples and conditions. It will be appreciated that those skilled in the art may devise various arrangements which, although not explicitly described or shown herein, nonetheless embody the principles of the present technology and are included within its spirit and scope.

Furthermore, as an aid to understanding, the following description may describe relatively simplified implementations of the present technology. As persons skilled in the art would understand, various implementations of the present technology may be of a greater complexity.

In some cases, what are believed to be helpful examples of modifications to the present technology may also be set forth. This is done merely as an aid to understanding, and, again, not to define the scope or set forth the bounds of the present technology. These modifications are not an exhaustive list, and a person skilled in the art may make other modifications while nonetheless remaining within the scope of the present technology. Further, where no examples of modifications have been set forth, it should not be interpreted that no modifications are possible and/or that what is described is the sole manner of implementing that element of the present technology.

Moreover, all statements herein reciting principles, aspects, and implementations of the present technology, as well as specific examples thereof, are intended to encompass both structural and functional equivalents thereof, whether they are currently known or developed in the future. Thus, for example, it will be appreciated by those skilled in the art that any block diagrams herein represent conceptual views of illustrative circuitry embodying the principles of the present technology. Similarly, it will be appreciated that any flowcharts, flow diagrams, state transition diagrams, pseudo-code, and the like represent various processes which may be substantially represented in computer-readable media and so executed by a computer or processor, whether or not such computer or processor is explicitly shown.

The functions of the various elements shown in the figures, including any functional block labeled as a "processor" or a "graphics processing unit", may be provided through the use of dedicated hardware as well as hardware capable of executing software in association with appropriate software. When provided by a processor, the functions may be provided by a single dedicated processor, by a single shared processor, or by a plurality of individual processors, some of which may be shared. In one or more non-limiting embodiments of the present technology, the processor may be a general purpose processor, such as a central processing unit (CPU) and/or a processor dedicated to a specific purpose, such as a graphics processing unit (GPU) and/or a data processing unit (DPU). Moreover, explicit use of the term "processor" or "controller" should not be construed to refer exclusively to hardware capable of executing software, and may implicitly include, without limitation, digital signal processor (DSP) hardware, network processor, application specific integrated circuit (ASIC), field programmable gate array (FPGA), read-only memory (ROM) for storing software, random access memory (RAM), and non-volatile storage such as non-volatile random-access memory (NVRAM). Other hardware, conventional and/or custom, may also be included.

Software modules, or simply modules which are implied to be software, may be represented herein as any combination of flowchart elements or other elements indicating performance of process steps and/or textual description. Such modules may be executed by hardware that is expressly or implicitly shown.

With these fundamentals in place, we will now consider some non-limiting examples to illustrate various implementations of aspects of the present technology.

Electronic Device

Referring to FIG. 1, there is shown an electronic device 100 suitable for use with some implementations of the present technology, the electronic device 100 comprising various hardware components including one or more single or multi-core processors collectively represented by processor 110, a graphics processing unit (GPU) 111, a solid-state drive 120, a random-access memory 130, a display interface 140, and an input/output interface 150.

Communication between the various components of the electronic device 100 may be enabled by one or more internal and/or external buses 160 (e.g. a PCI bus, universal serial bus, IEEE 1394 "Firewire" bus, SCSI bus, Serial-ATA bus, etc.), to which the various hardware components are electronically coupled.

The input/output interface 150 may be coupled to a touchscreen 190 and/or to the one or more internal and/or external buses 160. The touchscreen 190 may be part of the display. In one or more embodiments, the touchscreen 190 is the display. The touchscreen 190 may equally be referred to as a screen 190. In the embodiments illustrated in FIG. 1, the touchscreen 190 comprises touch hardware 194 (e.g., pressure-sensitive cells embedded in a layer of a display allowing detection of a physical interaction between a user and the display) and a touch input/output controller 192 allowing communication with the display interface 140 and/or the one or more internal and/or external buses 160. In one or more embodiments, the input/output interface 150 may be connected to a keyboard (not shown), a mouse (not shown) or a trackpad (not shown) allowing the user to interact with the electronic device 100 in addition or in replacement of the touchscreen 190. It will be appreciated that some embodiments of the present technology may be implemented without user interface components such as the touchscreen 190.

According to implementations of the present technology, the solid-state drive 120 stores program instructions suitable for being loaded into the random-access memory 130 and executed by the processor 110 and/or the GPU 111 for dynamically slicing, reducing, and bit packing serialized data stream to obtain packed data. For example, the program instructions may be part of a library or an application. It is contemplated that embodiments of the present technology could be implemented to transmit data between components of the electronic device 100, for example NVMe drivers could be modified to send compressed logs to the processor 110 via the internal and/or external buses 160.

The electronic device 100 may be implemented as a server, a desktop computer, a laptop computer, a tablet, a smartphone, a personal digital assistant or any device that may be configured to implement the present technology, as it may be understood by a person skilled in the art.

System

Figure 2:
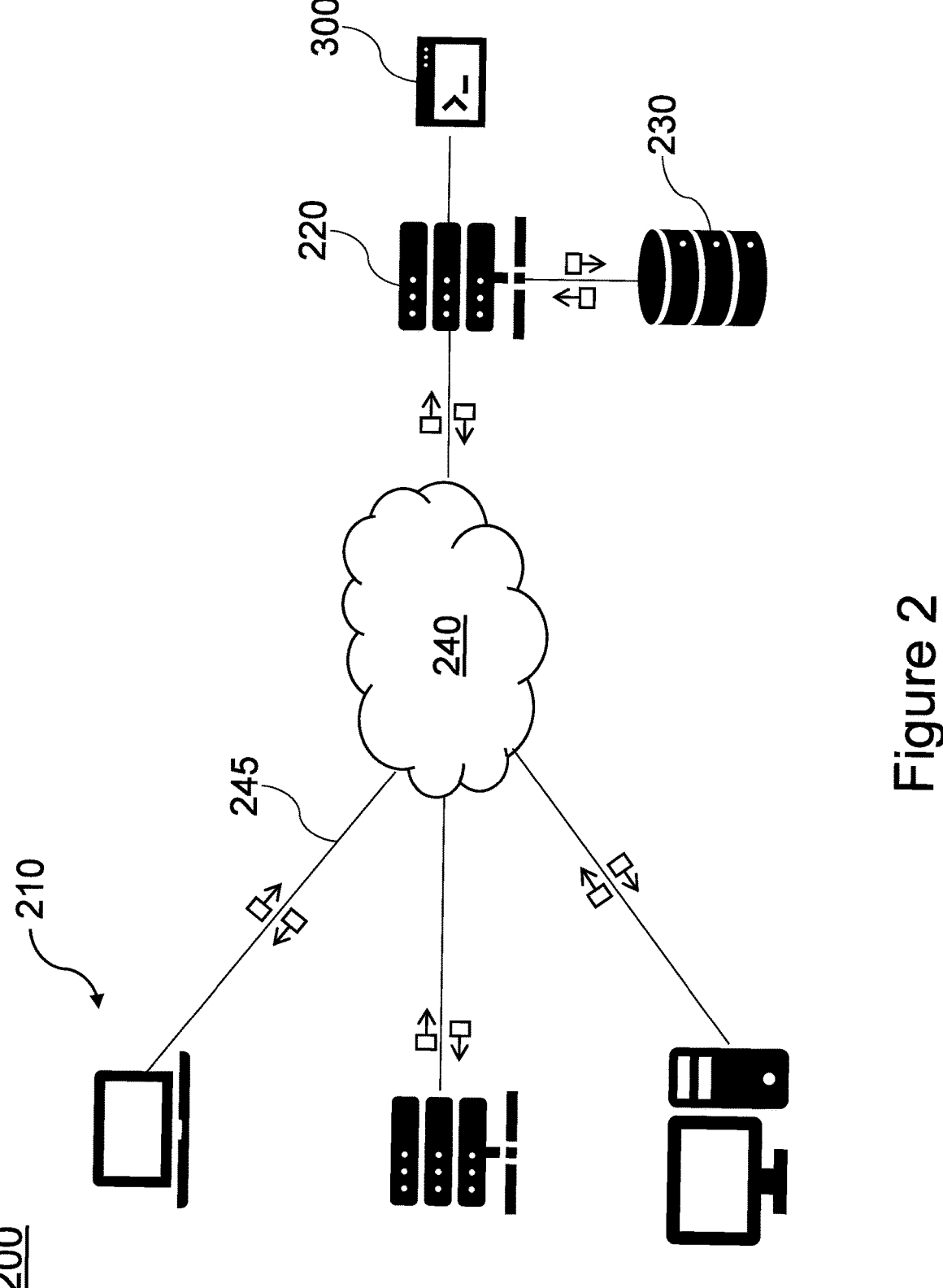
FIG. 2 depicts a schematic diagram of a communication system in accordance with one or more non-limiting embodiments of the present technology.

Referring to FIG. 2, there is shown a schematic diagram of a system 200, the system 200 being suitable for implementing one or more non-limiting embodiments of the present technology. It is to be expressly understood that the system 200 as shown is merely an illustrative implementation of the present technology. Thus, the description thereof that follows is intended to be only a description of illustrative examples of the present technology. This description is not intended to define the scope or set forth the bounds of the present technology. In some cases, what are believed to be helpful examples of modifications to the system 200 may also be set forth below. This is done merely as an aid to understanding, and, again, not to define the scope or set forth the bounds of the present technology. These modifications are not an exhaustive list, and, as a person skilled in the art would understand, other modifications are likely possible. Further, where this has not been done (i.e., where no examples of modifications have been set forth), it should not be interpreted that no modifications are possible and/or that what is described is the sole manner of implementing that element of the present technology. As a person skilled in the art would understand, this is likely not the case. In addition, it is to be understood that the system 200 may provide in certain instances simple implementations of the present technology, and that where such is the case they have been presented in this manner as an aid to understanding. As persons skilled in the art would understand, various implementations of the present technology may be of a greater complexity.

The system 200 comprises inter alia a plurality of client devices 210, a server 220, and a database 230 communicatively coupled over a communications network 240.

Client Devices

The system 200 comprises a plurality of client devices 210.

In one or more embodiments, one or more of the plurality of client devices 210 may be associated with a user (not depicted). As such, the client device can sometimes be referred to as a "electronic device", "end user device" or "client electronic device". In one or more other embodiments, one or more of the plurality of client devices 210 may be servers (e.g., cloud servers) providing functionality and resources to other client devices and may be associated with respective operator(s).

Each of the plurality of client devices 210 comprises one or more components of the electronic device 100 such as one or more single or multi-core processors collectively represented by the processor 110, the graphics processing unit (GPU) 111, the solid-state drive 120, the random-access memory 130, the display interface 140, and the input/output interface 150.

It will be appreciated that each of the plurality of client devices 210 may be implemented differently, and a given one of the plurality of client devices 210 may be implemented as a server, a desktop computer, a laptop, a tablet, a smartphone and the like. In one or more other embodiments, one or more of the plurality of client devices 210 may be implemented as smart devices such as, but not limited to smartphones, smart cars, smart thermostats, smart doorbells, smart locks, smart refrigerators, phablets and tablets, smartwatches, smart bands, smart key chains, smart glasses, and the like.

It should be expressly understood that implementations for the plurality of client devices 210 are provided for illustration purposes only. While only four client devices are illustrated (all are shown in FIG. 2), it is contemplated that any number of client devices 210 could be connected to the server 220 of the system 200. It is further contemplated that in some implementations, the number of client devices 210 included in the system 200 could number in the tens or hundreds of thousands. As such, those skilled in the art will easily appreciate other specific implementational details for these elements. As such, examples provided herein above are not meant to limit the scope of the present technology.

In one or more embodiments, a given one of the plurality of client devices 210 is configured to inter alia: (i) connect to the server 220; and (ii) transmit requests for data to the server 220; (iii) receive packed data from the server 220; and (iv) unpack the packed data to obtain the requested data.

In one or more embodiments, a given one of the plurality of client devices 210 is configured to unpack and decode the serialized data using the methods and techniques that will be described herein below.

As a non-limiting example, the serialized data requested from the server 220 may be in the JSON format. As another non-limiting example, the data requested from the server 220 may be in XML format.

Server

The server 220 is configured to inter alia: (i) receive a request for data; (ii) retrieve, based on the request, the requested data; (iii) serialize the requested data to obtain serialized data; (iv) dynamically slice, compress, and bit pack the requested serialized data to obtain bit packed data; and (v) provide the bit packed serialized data for transmission to the given one of the plurality of client devices 210.

In one or more embodiments, the server 220 executes the aforementioned processes without receiving a request, i.e., the server 220 receives serialized data and dynamically slices, compresses, and packs serialized data to obtain packed data, which is transmitted to another computing device.

In one or more embodiments, the server 220 implements a data reduction packing service 320 (FIG. 3) executing a data reduction and packing procedure 400 (FIG. 4) to provide at least a portion of the aforementioned functionalities.

The server 220 is configured to provide an application programming interface (API).

In one or more embodiments, the server 220 is configured to retrieve serialized data from the database 230 in response to a request from a given one of the plurality of client devices 210. In one or more other embodiments, the server 220 is configured to retrieve the data from another electronic device (not illustrated) coupled to the communications network 240. As a non-limiting example, the requested data may be obtained from an internet of things (IoT) connected device, which may stream data to the server 220.

In one or more embodiments, the functionality of the server 220 may be implemented by the IoT device.

How the server 220 is configured to do so will be explained in more detail herein below.

It will be appreciated that the server 220 can be implemented as a conventional computer server and may comprise at least some of the features of the electronic device 100 shown in FIG. 1. In a non-limiting example of one or more embodiments of the present technology, the server 220 is implemented as a server running an operating system (OS), such as Windows Server® or LINUX®. Needless to say that the server 220 may be implemented in any suitable hardware and/or software and/or firmware or a combination thereof. In the disclosed non-limiting embodiment of present technology, the server 220 is a single server. In one or more alternative non-limiting embodiments of the present technology, the functionality of the server 220 may be distributed and may be implemented via multiple servers (not shown).

The implementation of the server 220 is well known to the person skilled in the art. However, the server 220 comprises a communication interface (not shown) configured to communicate with various entities (such as the database 230 and the plurality of client devices 210, for example and other devices potentially coupled to the communication network 240) via the communication network 240. The server 220 further comprises at least one computer processor (e.g., the processor 110 of the electronic device 100) operatively connected with the communication interface and structured and configured to execute various processes to be described herein.

In one or more embodiments, the server 220 is configured to provide a cloud service to the plurality of client devices 210 which may include processing servers, storage, databases, networking, and software. Users of or entities associated with the plurality of client devices 210 may use the cloud service provided by the server 220 to create applications and services, store data, back up data and recover data, host websites and blogs, stream audio and video, deliver software on demand and analyze data for patterns and make predictions. A non-limiting example of a cloud architecture will be described hereinbelow with reference to FIG. 3.

Database

A database 230 is communicatively coupled to the server 220 and the client device 210 via the communications network 240 but, in one or more alternative implementations, the database 230 may be directly coupled to the server 220 without departing from the teachings of the present technology. Although the database 230 is illustrated schematically herein as a single entity, it will be appreciated that the database 230 may be configured in a distributed manner, for example, the database 230 may have different components, each component being configured for a particular kind of retrieval therefrom or storage therein.

The database 230 may be a structured collection of data, irrespective of its particular structure or the computer hardware on which data is stored, implemented or otherwise rendered available for use. The database 230 may reside on the same hardware as a process that stores or makes use of the information stored in the database 230 or it may reside on separate hardware, such as on the server 220. The database 230 may receive data from the server 220 for storage thereof and may provide stored data to the server 220 for use thereof.

In one or more embodiments of the present technology, the database 230 is configured to store inter alia: (i) serializable data; and (ii) configuration parameters of a data reduction service In one or more other embodiments, the database 230 may be optional.

Communication Network

In one or more embodiments of the present technology, the communications network 240 is the Internet. In one or more alternative non-limiting embodiments, the communication network 240 may be implemented as any suitable local area network (LAN), wide area network (WAN), a virtual local area network (VLAN) (e.g., VNET, CNI, VXLAN, etc.) a private communication network or the like. It will be appreciated that implementations for the communication network 240 are for illustration purposes only, and while a single communication network 240 is illustrated, it is contemplated that a plurality of communications networks between components of the system 200 may be used. How a communication link 245 (not separately numbered) between the client devices 210, the server 220, the database 230, and/or another electronic device (not shown) and the communications network 240 is implemented will depend inter alia on how each electronic device is implemented.

The communication network 240 may be used in order to transmit data packets amongst the server 220 and the plurality of client devices 210. For example, the communication network 240 may be used to transmit requests from a given one of the plurality of client devices 210 to the server 220. In another example, the communication network 240 may be used to transmit data from the server 220 to another given one of the plurality of client devices 210.

The system 200 is only provided as a non-limiting example of a computing environment where the present technology may be implemented, and it should be understood that embodiments of the present technology may be implemented between two computing devices connected to each other (e.g., server 220 and a single client device 210) or by a single computing device (e.g., between components within a single enclosure having required processing capabilities).

Cloud Infrastructure Architecture

Figure 3:
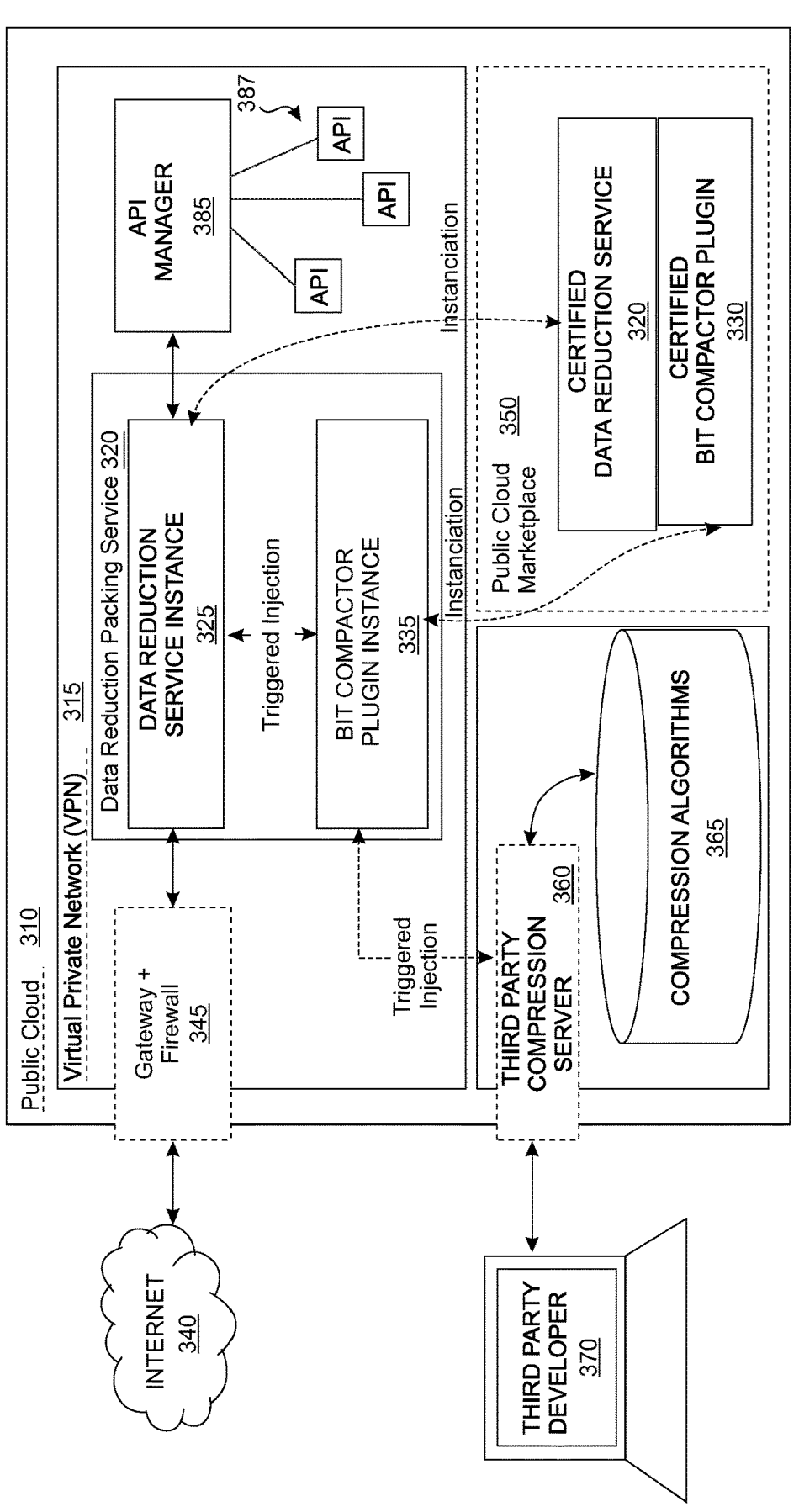
FIG. 3 depicts a schematic diagram of a non-limiting example of cloud infrastructure architecture implemented within the communication system of FIG. 2.

With reference to FIG. 3, there is shown a schematic diagram of a non-limiting example of a cloud infrastructure architecture 300.

The cloud infrastructure architecture 300 may be implemented and executed within at least a portion of the system 200. It will be appreciated that the cloud infrastructure architecture 300 is only provided as a non-limiting example of an environment where one or more embodiments of the present technology may be implemented, and as such, at least some embodiments of the present technology may not be implemented within a cloud computing environment.

The cloud infrastructure architecture 300 comprises a public cloud service 310 connected to the internet 340 via a gateway and firewall 345. It will be appreciated that the internet 340 may be an implementation of the communication network 240 of FIG. 2, and the public cloud service 310 may be implemented at least in part by the server 220 of FIG. 2.

The public cloud service 310 is managed by a cloud provider and provides cloud resources over the internet 340. As a non-limiting example, the public cloud service 310 may provide cloud services and resources to the plurality of client devices 210 of FIG. 2.

The public cloud service 310 comprises a virtual private network (VPN) 315. It will be appreciated that the VPN 315 is another communication network provided for illustrative purposes only, and the public cloud service 310 may include other types of networks as detailed herein above. The VPN 315 uses encryption to create a private network over the top of the internet 340 within the public cloud service 310.

The public cloud service 310 executes a data reduction packing service 320. The data reduction packing service 320 comprises a data reduction service instance 325 and a bit compactor plugin instance 335.

The purpose of the data reduction packing service 320 is to operate transparently on serialized data to be transmitted from the public cloud service 310 (e.g., implemented using the server 220) over the internet 340 so as to reduce its size, thereby reducing bandwidth consumption and costs for clients of the public cloud service 310 (e.g., the plurality of client devices 210), without losing information contained in the original data. More specifically, the data reduction packing service 320 operates in a transient manner on the redundancy of serialized data structures by using a combination of dynamic, adaptive and differential slicing and reduction techniques by leveraging on the different types and/or formats in the serialized data, by organizing and grouping redundant data structures included therein, which enable obtaining, in some instances, compression ratios which may not be possible or may be difficult to obtain using single traditional compression techniques and/or single binary data reduction approaches. If necessary, structural and functional elements in serialized data sequences may be further compressed using known traditional compression techniques.

The data reduction service instance 325 is in communication with an API manager 385 connected to a plurality of APIs 387, and to the bit compactor plugin instance 335. The bit compactor plugin instance 335 triggers injections in the data reduction service instance 325. The API manager 385 provides the functionalities of the data reduction packing service 320 via the plurality of APIs 387 which may be accessible to at least a portion of the clients using the public cloud service 310.

In one or more embodiments, the public cloud service 310 further comprises a public cloud marketplace 350 providing a certified data reduction packing service 352 and a certified bit compactor plugin 354 to client devices to client devices (e.g., the plurality of client devices 210 of FIG. 2). The certified data reduction packing service 352 is instantiated in the data reduction service instance 325 and the certified bit compactor plugin 354 is instantiated in the bit compactor plugin instance 335. It will be appreciated that the public cloud marketplace 350 may be optional in some embodiments of the present technology.

The public cloud service 310 further comprises a third party compression server 360 connected to a compression algorithm database 365. Third party developer(s) 370 (e.g., individual(s), companies, academic researchers, etc.) may connect to the third party compression server 360 via the internet 340 to provide compression algorithms, which may be in a domain-specific language and which may be stored in the compression algorithm database 365.

The third party compression server 360 triggers injections in the bit compactor plugin instance 335 using one or more compression algorithms stored in the compression algorithm database 365.

In the context of the present technology, the third party compression server 360 may optionally use a domain specific language from the compression algorithms database 365 to define additional or alternative compression techniques. The third party developer(s) 370 can easily define algorithms without having to deal with the complexity of low-level bit-packing techniques executed by the bit compactor plugin instance 3 and focus on the compression techniques. The use of a Domain Specific Language (DSL) decouples the higher level logic from the low level implementation of the bit compactor plugin instance 335. This allows, for example, easier performance improvements or platform specific development on lower level layers without involving directly the third party developers 370, while maintaining compatibility. Injection can be made, at runtime, as these can be easily executed by a virtual machine or can be just-in-time compiled.

A non-limiting example of a DSL that may be used to avoid passing the first 255 redundant characters in a prefixes of URL values is provided below:

```
On condition:
    Previous value:
        Capitalized:
        Begins with:
            'HTTP'
    Current value:
        Capitalized:
        Begins with:
            'HTTP'
Return:
    Length:
        Match:
            Max:
                255
    Matching prefix:
        Previous value
    Unmatched Suffix:
        Previous value
```

Figure 4:
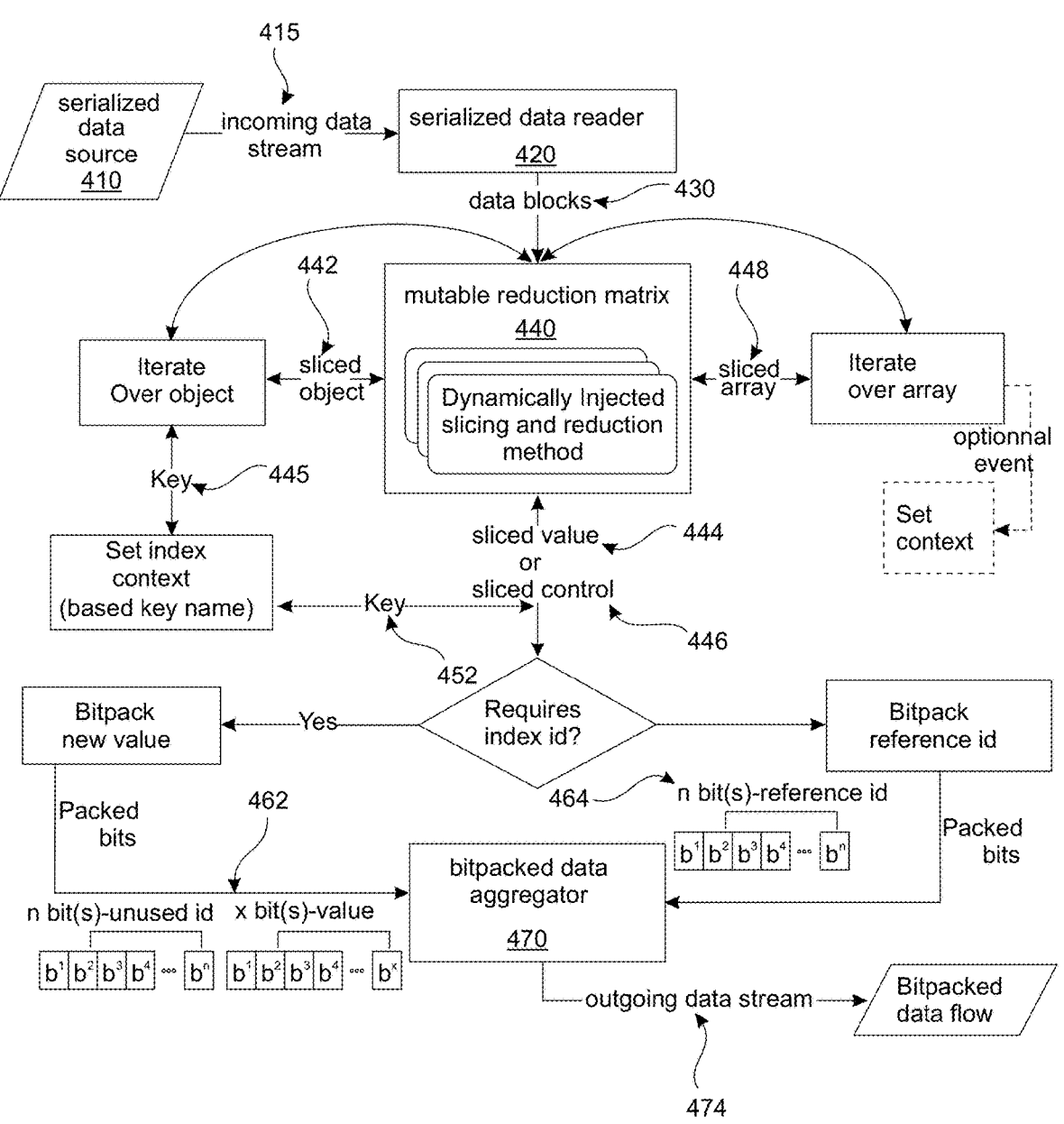
FIG. 4 depicts a schematic diagram of a serialized data source and a data reduction and packing procedure in accordance with one or more non-limiting embodiments of the present technology.

With reference to FIG. 4, a data reduction and packing procedure 400 implemented by the data reduction packing service 320 will now be described in accordance with one or more non-limiting embodiments of the present technology.

Data Reduction and Packing Procedure

The data reduction and packing procedure 400 is executed by one or more processor(s), such as a processor 110 and/or GPU 111 of the server 220. As a non-limiting example with reference to FIG. 3, the data reduction and packing procedure 400 may be executed as part of the data reduction packing service 320 by the data reduction service instance 325 and the bit compactor plugin instance 335.

In one or more alternative embodiments, the data reduction and packing procedure 400 may be executed locally by a processor within a single computing device.

The data reduction and packing procedure 400 is executed for every communication session (i.e., interactive information exchange between communicating devices). When the current session ends or interrupts, data is not stored in a non-transitory manner, and the data reduction and packing procedure 400 may be re-executed. It will be appreciated that a plurality of data reduction and packing procedures 400 may be executed in parallel and independently (i.e., without sharing index information) on different serialized data sequences by the processor.

In one or more embodiments, the data reduction and packing procedure 400 is configured to inter alia: (i) interface with a serialized data source 410; (ii) receive a serialized data sequence in the form of serialized data stream 415 from the serialized data source 410; (iii) dynamically and recursively slice and reduce, by using a reduction matrix 440, the serialized data stream 415 to obtain a set of sliced data portions, where each sliced data portion has a respective custom structure based on the serialized data type, the custom structure including an index and/or at least one reference value, and a respective set of values associated with the respective index; (iv) bit pack at least a portion of the set of sliced portions to obtain a bit packed serialized data; (v) provide the packed serialized data for transmission.

The data reduction and packing procedure 400 operates on data blocks in the serialized data stream 415 on-the-fly as it is made available for processing over time, and does not require a priori knowledge of the content of serialized data blocks that have has not yet been processed or received in the serialized data stream.

In one or more embodiments, the packed serialized data stream is transmitted to another processor performing the reverse of the data reduction and packing procedure 400 (i.e., a data unpacking and reconstruction procedure (not illustrated)) to unpack and decode the packed serialized data to obtain the source serialized data stream 415.

Serialized Data Source

The data reduction and packing procedure 400 receives a serialized data stream 415 from a serialized data source 410 interfacing the data reduction and packing procedure 400. It will be appreciated that the nature of the serialized data source 410 is not limited and the serialized data source 410 may include one or more computing devices or components, computer-readable storage mediums, databases, and the like.

In one or more embodiments, the serialized data source 410 may be the database 230 of FIG. 2 and the serialized data stream 415 may be retrieved by the server 220 from the database 230 upon receiving a request from a given one of the plurality of client devices 210. In one or more other embodiments, the serialized data source 410 may be one of the plurality of client devices 210, and the serialized data stream 415 may include data requested by another one of the plurality of client device 210, where the serialized data stream 415 is processed by the data reduction and packing procedure 400 executed by the server 220 and transmitted back to the one of the plurality of client devices 210 having requested the data in the form of packed serialized data.

In one or more embodiments, the serialized data stream 415 may be generated based on a given data requested by a given one of the plurality of client devices 210. As a non-limiting example, in embodiments where the server 220 provides a cloud service in the form of the public cloud service 310 (FIG. 3), the serialized data stream 415 may correspond to a software data object which is requested by one of the plurality of client devices 210, and the serialized data source 410 may generate or retrieve the serialized data stream 415 representing the software data object for ease of storage and for transmission to the given one of client devices 210 via the server 220.

In one or more other embodiments, the serialized data source 410 may transmit the serialized data stream 415 without receiving a request from the server 220

As a non-limiting example, the serialized data source 410 may be, or may receive serialized data from an IoT device (not illustrated). It will be appreciated that the type of IoT device is not limited and may include consumption IoT devices, commercial IoT devices, military IoT devices, industrial IoT devices, and the like. The IoT device may be for example implemented as a smart speaker, a smart tracker, a satellite, a radar, one or more sensors, a surveillance robot, a drone, a smart vehicle (e.g. smart car), a smart thermostat, a smart doorbell, a smart lock, a smart refrigerator, a phablet or tablet, a smartwatch, a smart band, a smart key chain, smart glasses, etc.

In one or more other embodiments, the serialized data source 410 may be located and implemented within the electronic device executing the data reduction and packing procedure 400, such as a component of the electronic device 100 in connection with the processor 110 or GPU 111.

The serialized data stream 415 is a byte representation of one or more serialized data objects comprising the object's data, information about the object's type, types of data stored in the object and additional metadata.

It will be appreciated that the serialized data stream 415 may be streamed in a byte representation form to the data reduction and packing procedure 400, or may be converted into a byte representation (e.g., by the serialized data source

410, the data reduction and packing procedure 400 or another procedure/device). It will be appreciated that the serialized data object(s) in the serialized data stream 415 may be obtained from a region of memory (i.e., memory location) using a memory address.

It will be appreciated that the information included in the serialized data stream 415 depends on the type of serialization language. In one or more alternative embodiments, data in the serialized data stream 415 may have been serialized using an object-oriented programming language.

As a non-limiting example, for the JAVA programming language, the serialized data stream 415 may include a header with version number, object, class description, class name length, string, class serial version identifier, support serialization, number of fields, field type, field name length, string value, superclass description, class name length, string value, class hierarchy etc. It will be appreciated that one or more embodiments of the present technology may be used with interpreted languages.

The serialized data stream 415 represent one or more (i.e., at least one) serialized data objects each having a serialized object data type. The serialized data object may include other objects, controls, numerals, arrays, strings, and/or characters.

The serialized object data type may include one of: a list (a.k.a. collections or arrays), an object (which include object properties and object values a.k.a. key-value pairs) and control values (a.k.a., leaf values) (e.g. float, Booleans, integer, etc.).

As a non-limiting example, in the case of the JSON language, an object literal is represented as {key; value} pair, where the key is a string and the value is another JSON object (i.e., number, string, array, object, Boolean, empty). More details about the JSON interchange standard are accessible in the documentation of the RFC 8259 standard and the documentation of the ISO/IEC 21778:2017 standard, which are incorporated herein by reference. JSON text is formed of Unicode code points and in an open echo system, JSON uses UTF-8 for character encoding (and UTF-16 surrogate pairs for characters outside the basic multilingual plane).

As a non-limiting example, for the JSON language, control values include six structural tokens (separated by semicolon): "[" (left square bracket); "{" (left curly bracket), "]" (right square bracket); "}" (right curvy bracket); ":" (colon); "," (comma). The JSON format includes literal name tokens: true, false and null, and insignificant whitespaces (allowed before or after any of the six structural characters: %x20 (Space); %x09 (Horizontal tab); %x0A (Line feed or New line); %x0D (Carriage return).

As a non-limiting example, A JSON value can be one of: object, array, number, string, true, false or null. It will be appreciated that in the JSON language, an object structure is represented as a pair of curly bracket tokens surrounding zero or more name/value pairs, and an array structure is a pair of square bracket tokens surrounding zero or more values.

Serialized Data Reader

The serialized data reader 420 is configured to inter alia: (i) obtain the incoming serialized data stream 415; (ii) generate, using the serialized data stream 415, a plurality of serialized data blocks 430; and (iii) transmit the plurality of serialized data blocks 430 which is processed using the mutable reduction matrix 440.

In one or more embodiments, the serialized data reader 420 is executed by the server 220 within the data reduction and packing procedure 400. In one or more other embodiments, the serialized data reader 420 is executed by another processor which receives the serialized data stream 415 and generates and transmits the plurality of serialized data blocks 430 to the server 220.

In the context of the present technology, the serialized data reader 420 reads the serialized data stream 415 sequentially and the size of the serialized data stream or amount of data therein is not known in advance (i.e., the serialized data stream 415 comprises a countably infinite sequence of elements and is used to represent data elements that are made available over time). The serialized data stream 415 thus ends when the current session ends (or there is an interruption in the current session). As a non-limiting example, the serialized data stream 415 may include one or more JSON (or other serialized data format) files.

The serialized data reader 420 is configured to generate fixed size blocks using the serialized data stream 415 to obtain the plurality of serialized data blocks 430. It will be appreciated that the serialized data stream 415 may be divisible into a number of serialized data blocks, where each data block may have a predetermined and fixed size. As a non-limiting example, a given data block may have a size of 64 kilobytes.

As non-limiting example, in the JSON language, a JSON object in a serialized data stream may be represented in blocks as detailed in TABLE 1 below.

TABLE 1

| Example of JSON expression with data blocks | | |
|---|---|---|
| JSON expression | Subindex | Block No |
| { | Key1: | 1 |
| "Key1": { | Nested1, | 2 |
| "Nested1": 1, | Nested2 | 3 |
| "Nested2": [3,4] | Nested1: | 4 |
| }, | 1 | 5 |
| "Key2": [55,88,10] | Nested2: | 6 |
| } | 3, | 7 |
| | 4 | 8 |
| | Key2: | 9 |
| | 55, | 10 |
| | 88, | 11 |
| | 10 | 12 |

The serialized data reader 420 continuously outputs the plurality of serialized data blocks 430 as the serialized data stream 415 is received. The data reduction and packing procedure 400 is configured to apply a mutable reduction matrix 440 on the plurality of serialized data blocks 430 to perform slicing thereof.

Reduction Matrix

The reduction matrix 440 is stored in memory and retrieved by the data reduction and packing procedure 400 for use on the plurality of serialized data blocks 430.

The data reduction and packing procedure 400 uses the reduction matrix 440 to inter alia: (i) receive as an input a given serialized data block of the plurality of serialized data blocks 430 from the serialized data reader 420; (ii) slice the given serialized data block into a sliced value associated with an index or sliced control, which is transmitted for bit packing; and (iii) recursively call the reduction matrix 440 until complete treatment of the plurality of serialized data blocks (e.g., end of a stream or end of the current session).

The data reduction and packing procedure 400 uses the reduction matrix 440 to perform reduction based on a size of elements in data blocks 430. The reduction matrix 440 uses one or more variable-length coding strategies to map serialized data blocks to a variable number of bits, which are then bit packed for further compression. The data reduction and packing procedure 400 continuously applies the reduction matrix 440 on the data blocks that are continuously obtained from the serialized data stream 415.

In one or more embodiments, the reduction matrix 440 may be implemented as a polymorphic injection matrix used to perform slicing and reduction of input serialized data based on data types and context in the input serialized data blocks by using dynamic types aligned with bits. The reduction matrix 440 leverages the standardized data structures in a data serialization format to create indexes.

The reduction matrix 440 is predefined by an operator of the present technology based on predefined conditions. The predefined conditions may be based on predefined serialized data types and/or serialized data formats. Thus, when the reduction matrix 440 encounters a predetermined condition, it may either use a predefined reduction technique or update itself to refer to and execute an appropriate reduction technique, i.e., inject the appropriate reduction technique to obtain sliced data. The reduction matrix 440 assigns a reduction technique dynamically based on the serialized sliced data type and/or serialized data format. A set of reduction techniques may be provided for the predefined conditions.

In one or more embodiments, during execution, it will be appreciated that the reduction matrix 440 does not evaluate conditions per say, but rather performs a polymorphic call that is evaluated directly, which enables reducing the processing time, which is crucial for data reduction (i.e., compression). The reduction matrix 440 enables replacing a given reduction technique by another adapted given reduction technique by modifying the custom structure in memory comprising the index to write the other adapted given reduction technique.

In one or more embodiments, the appropriate reduction technique may be retrieved from the compression algorithm database 365 (FIG. 3) based on specific conditions, e.g., when a given serialized data format is encountered, the reduction matrix 440 may refer to a specific compression technique.

In one or more embodiments, the reduction matrix 440 may be in the form of a two-dimensional (i.e., two-level) array with key:values, where the values are processes, i.e., reference (i.e., pointers) to reduction code blocks that may be either stored in the reduction matrix 440 itself, or may be external (i.e., retrieved from a memory, or from the packed data stream itself). Since the reduction matrix 440 is mutable and dynamic, the size of the reduction matrix 440 may change at run time during execution when iterating over the serialized data blocks 410.

In one or more embodiments, the reduction matrix 440 is dynamic, mutable and operates by injection, i.e., is updated and modified dynamically in real-time during the data reduction and packing procedure 400 when operating on the serialized data blocks 430 such that it can call an appropriate reduction technique based on the condition (i.e., format or data type).

In one or more alternative embodiments, the reduction matrix 440 may be static.

In one or more embodiments, the reduction matrix 440 may be implemented as a mutable injection reduction matrix. In the context of the present technology, the injection employed is similar to concepts in inversion of control (IoC) programming principles, where code to be executed is modified at runtime when the reduction matrix 440 encounters a predetermined data type and/or data format. The reduction matrix 440 thus applies slicing and reduction techniques on the plurality of data blocks 430 based on the associated predetermined data types and/or predetermined data formats.

In one or more embodiments, the reduction matrix 440 is configured to use overflow techniques for data serialized in JSON to encode handling operations metadata by using an offset/overflow technique to leverage the potential plurality of unused ids to map operations on a predefined table, as detailed below in TABLE 3.

As a non-limiting example, for date fields in a JSON data block, where a string may include ####/##/##type fields, the reduction matrix 440 may process the string according to a predefined "date" type, and refer to a specific compression technique based on the assumption that for a given context and transmitted sequences, dates are generally expressed within ranges of 64 or 128 years for a given transmitted sequence, that months have less than 16 possible values, days have less than 32 possible values and that there may be only one date format, which enables optimizing compression of such serialized sequences in an adaptive manner.

As another non-limiting example, the age of an individual in an object may be represented using a number (e.g., int16 or int32 in some languages). However, the range of an individual's age is generally between 0 and 100, which only requires 8 bits to be represented. An "age" format condition and reduction technique may thus be stored accordingly in the reduction matrix 440.

The reduction matrix 440 enables avoiding redundancy in data fields names when instances are present in a list of objects.

The reduction matrix 440 operates dynamically and in real-time on the input serialized data blocks 430 by verifying conditions for each serialized data type and by performing slicing of data blocks adaptively i.e., depending on inter alia the result of the condition and the serialized data type, to obtain a plurality of sliced portions. The reduction matrix 440 operates recursively on the input serialized data stream blocks to generate an optimal data structure which reduces memory space while maintaining information contained in the serialized data stream, thereby improving transmission speed. The reduction matrix 440 functions through dynamic injection of "in memory" mutable processes, which can be injected at any time whenever some conditions are met while processing the data. As a result, the reduction matrix 440 keeps the data handling simple, powerful, flexible and efficient.

The reduction matrix 440 performs slicing of the input plurality of serialized data blocks 430 to generate a plurality of data slices (a.k.a. sliced data portions), where each data slice is a data structure including the same type of element. The reduction matrix 440 dynamically assigns a reduction technique based on the type of the data slice and the given context (if the context includes delimitations and conditions) by using bit aligned dynamic data types. The reduction matrix 440 performs reduction based on a size of the data elements in blocks, as opposed to the number of data elements. The reduction matrix 440 has access to one or more predetermined and/or one or more injected reduction methods, which enables the reduction matrix to process information according to its own rules, which enables compressing the streamed serialized data sequences optimally and in a custom manner.

The reduction matrix 440 operates continuously and recursively on the plurality of data blocks and obtained data slices to perform slicing and reduction until the end of the serialized data stream 415.

In one or more embodiments, the reduction matrix 440 comprises a plurality of reduction sub-matrices, each defined for a corresponding data type, where a given sub-matrix in the plurality of sub-matrices may refer to (i.e., call) another given sub-matrix in the plurality of sub-matrices when it encounters a data type for which it was defined.

The reduction matrix 440 initializes an index.

Index

When operating on the serialized data blocks 430, the reduction matrix 440 dynamically generates an index (not illustrated) in memory, and includes an indication of the index as part of the outgoing data stream 474. The index is generated and maintained in memory during the data reduction and packing procedure 400 for the session only. During reconstruction of the outgoing data stream 474 (i.e., by the reverse unpacking and reconstruction process), the index is dynamically re-generated directly from the bit packed data stream 474, and the processor implementing the reverse unpacking and reconstruction process does not require a priori knowledge of the index (i.e., it is not stored or transmitted before decoding the bit packed data stream 474). The index is passed in the outgoing data stream 474, which enables having references to the index with less bits than at the start of the outgoing data stream 474 during the current session. It will be appreciated that this improves security, as the bit packed data stream 474 uniquely (or almost uniquely) encodes the index of the current session based on the content in the source serialized data stream.

The index is a mutable type of container including immutable elements in the form of key:value types. It will be appreciated that an index may include a plurality of indexes (i.e., sub-indexes), each associated with a respective index context.

The index context should be understood as being the current index (i.e., sub-index) in use with respective metadata associated therewith (e.g., last entered URL, first entered date, or any information that may be added to facilitate processing thereof). The index context may be interpreted as being a state of an automaton. The index context is a reference to the index (i.e., subindex).

Each index context is uniquely identified by the data reduction and packing procedure 400 and is a global state. For a given sliced serialized data portion, the index context may change and depends on the sliced serialized data type.

The index context may include one of: a default index context, a key index context (i.e., based on a sliced key name or a position) and an array index context (i.e., based on a sliced array name), as will be explained in further detail herein below.

An index and an index context may be represented using HashMaps, vectors, and/or arrays, which are stored temporarily in memory during the current session. Thus, if there is an interruption in the transmission of data during the current session or the current session ends, the indexes are deleted and must be regenerated in a subsequent session. It will be appreciated that enables minimizing the size of the index, which is specific to the current session (as opposed to adding information to a global index stored for a plurality of sessions).

It will be appreciated that the size of the index influences the number of bits that will be transmitted and read. The index size is used to dynamically calculate the bit array length instead of transmitting it.

In the context of the present technology, slicing of the data reduces the index size, thereby reducing the number of bits needed to represent its reference ids. It will be appreciated that the number of bits do not need to be referenced.

Non-limiting examples of portions of the reduction matrix 440 for string and char datatype are provided in the following code in the PYTHON programming language in TABLE 2 below.

TABLE 2

| Example of mutable reduction matrix for slicing strings and characters: | |
| --- | --- |
| String slicing matrix | Char slicing matrix |
| slicing_matrix = [<br>('[', self.__add_list),<br>(']', self.__end_list),<br>('{', self.__add_dict),<br>(':', self.__add_key),<br>('}', self.__end_dict),<br>("null"), self.__slice_null_litteral) ,<br>("true", self.__slice_true_litteral),<br>("false",<br>  self.__slice_false_value),<br>('0123456789.Ee+-',<br>self.__slice_numerical_value),<br>("", self.__add_string #replaces the<br>matrix by the char matrix) | slicing_matrix = [<br>(char.bytes:1, self.__add<br>basic'),<br>("", self.__end_string<br>#replaces the matrix by the<br>string matrix)),<br>(char.bytes:2,<br>self.__add_2_bytes')<br>(char.bytes:3\|4,<br>self.__add_3_or_4_bytes')<br>] |

In one or more embodiments, for a given iteration, the reduction matrix 440 may obtain one of a sliced object 442 and a sliced array 448 during the data reduction and packing procedure 400.

Sliced Objects

The sliced object 442 is in the form of a key:value pair, where the key is a unique identifier and is associated with a value, the value having a respective data type (e.g., string, array, object, numeral, Boolean, empty). In one or more embodiments, the key may be in the form of a string (i.e., sequence of characters).

If the reduction matrix 440 outputs a sliced object 442, the data reduction and packing procedure 400 iterates over the content of the sliced object 442 (i.e., nested content) by returning the sliced object 442 as an input to the reduction matrix 440. It will be appreciated that the sliced object 442 may include one or more nested objects, numerals, strings, characters, controls, etc. which will be continuously sliced by the reduction matrix 440.

The data reduction and packing procedure 400 passes the key 452 associated with the sliced object 442. It will be appreciated that the key 452 is unique and enables identifying values (object properties) associated therewith. The key 452 is a type of sliced value that will be treated by the reduction matrix 440.

The data reduction and packing procedure 400 sets an index context based on the key 452. In one or more embodiments, the data reduction and packing procedure 400 sets the index context based on a name of the key 450 (i.e., represented as a string). The index context should be understood as being the index in current use with respective metadata associated therewith (e.g., last entered URL, first entered date, or any information that may be added to facilitate processing thereof). As will be explained below, if the key 452 does not exist in the index, the data reduction and packing procedure 400 adds it to the index, and if it exists, the data reduction and packing procedure 400 references it, and there's additional handling of a key 452 because it changes the context.

The data reduction and packing procedure 400 passes the key 450 as a sliced value 444.

Sliced Arrays

If the reduction matrix 440 obtains a sliced array 448, the data reduction and packing procedure 400 iterates over the content of the sliced array 448 by returning the sliced array 448 as an input to the reduction matrix 440. It will be appreciated that the sliced array 448 includes elements which may be nested data types such as objects, numerals, strings, characters, controls, arrays, etc. The elements of the sliced array 448 are returned to the reduction matrix 440 for further slicing and reduction. The reduction matrix 440 processes each of the elements in the sliced array 448 and nests elements iteratively.

The reduction matrix 440 processes each given element having a data type in the sliced array 448 accordingly by iterating over the given element, as well as over the nested elements in the sliced array 448.

In one or more embodiments, the data reduction and packing procedure 400 sets an index context for the sliced array 448. It will be appreciated that the setting of an index context for a sliced array 448 is optional.

In one or more embodiments, for a sliced array of strings (list of textual values), the reduction matrix 440 detects the array based on the array context, i.e., an array begins with "[" and ends with "]". The reduction matrix 440 passes the strings between the array delimiters to a string reduction technique, which is adapted to reduce string data types (values). In one or more embodiments, the strings may be encoded using control overflow. The string reduction technique may index the characters in the string as it is being transmitted, and sends back the characters as an input to the reduction matrix 440 for further slicing.

In one or more embodiments, for a sliced array of characters (string), the reduction matrix 440 detects the array based on the context, i.e., string delimiters "and". The reduction matrix 440 passes the characters between the string delimiters to a character reduction technique, e.g., UTF-8 reduction technique.

At each given iteration, the reduction matrix 440 outputs one of: a sliced value 444 and a sliced control 446. It should be understood that sliced values and sliced controls are the "basic" or "primitive" elements that are output by the reduction matrix 440, and may be associated with parent elements in some cases (i.e., may have been obtained from other data types).

Sliced Value

For a given iteration of the data reduction and packing procedure 400, the reduction matrix 440 outputs a sliced value 444.

In one or more embodiments, the sliced value 444 comprises value metadata (not illustrated). The value metadata provides information about the sliced value 444 and enables defining and/or describing the sliced value 444. The value metadata may include for example a flag bit, prefix bits, etc. As a non-limiting example, for APIs supporting date formats with different type separators, e.g., MM/DD/YYYY and MM-DD-YY, 10212016+0 on 1 bit could be used to encode date "10/21/2016", and 01012000+1 on 1 bit could be used to encode "01-01-2000", where the metadata corresponds to the format used with bit 0 for MM/DD/YYYY and with bit 1 for MM-DD-YY. As another non-limiting example, for a list of dates such as ["End of Filming date: 10/10/1996", "Air Date: 01/01/1997" ], ["End of Filming date: 08/01/ 2011", "Air Date: 11/07/2012", "Rerun date: 11/09/2012" ], 0 could be used to qualify End of Filming Date, 1 to qualify Air Date, and 2 to qualify Rerun Date. It will be appreciated that that metadata may also be used to qualify elements indirectly to chose a given injection method, e.g., 0 for Freeform text, 1 for URL, 2 for Freeform text with embedded numerical, and 3 for CSV.

In one or more embodiments, the value metadata enables specifying data not included in the serialized data stream 410.

For the given iteration, the data reduction and packing procedure 400 determines if the sliced value 444 requires an index id. To do so, the data reduction and packing procedure 400 verifies if the sliced value 444 is present in the index.

If the data reduction and packing procedure 400 determines that the sliced value 444 is not present in the index and it requires an index id, the data reduction and packing procedure 400 adds the sliced value as a new value to the index.

As explained above, the index should be understood as being a mutable type of container including immutable elements in the form of key:value types. When the index is empty, a sliced value 444 is not referenced, and the id of a sliced control may be used according to predefined table of possible operations. In other words, if the index is empty for the current context, a new id is not required and is defaulted to 0.

The data reduction and packing procedure 400 is configured to use a bit packing to bit pack the sliced value 444. The bit packing procedure may be executed by the bit compactor plugin instance 335 via triggered injection. Bit packing techniques are known in the art.

To add the sliced value 444 as a new value to the index, the data reduction and packing procedure 400 bit packs an unused id associated with the given sliced value 444 using a first number of bits n based on a current index length and using a second number of bits x to encode the sliced data value 444 to thereby obtain a given bit packed sliced value 462.

The first number of bits n represents the minimal number of bits that can contain a next unused id. The next unused id corresponds to the current index length+1. The second number of bits x is the minimum number of bits needed that can contain the indexed value.

Figure 5:
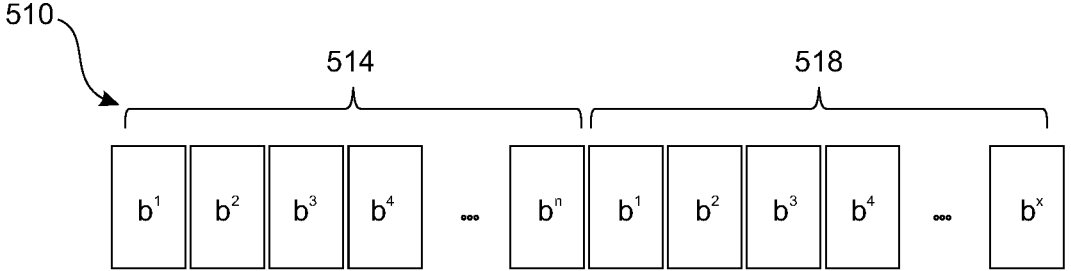
FIG. 5 depicts a schematic diagram of a value not present in the index being added to the index (top) and a value present in the index being referenced (bottom) in accordance with one or more non-limiting embodiments of the present technology.
Figure 5:
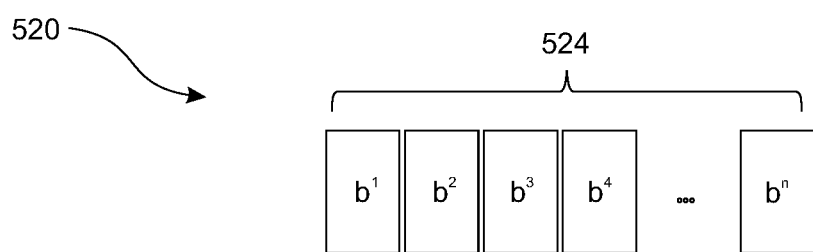

With brief reference to FIG. 5, there is illustrated the new value 510 added to the index with the first number of bits 514 and the second number of bits 518.

If the data reduction and packing procedure 400 determines that the sliced value 444 is present in the index, the data reduction and packing procedure 400 references the id present in the index by using a first number of bits n. In other words, a new id is not needed.

The data reduction and packing procedure 400 bit packs the reference id by using the first number of bits n to obtain another given bit packed sliced value 466.

In one or more embodiments, the reference id may be associated with or include control metadata. The control metadata may be solo control metadata or as an offset to the last index id.

With brief reference to FIG. 5, there is illustrated the existing value 520 in the index with the first number of bits 524 $n$.

Referring back to FIG. 4, for another given iteration, the data reduction and packing procedure 400 outputs a sliced control 446.

Sliced Control

It should be noted that the sliced control 446 is not indexed and is not associated with a value in the plurality of data blocks 430. The sliced control 446 is proper to the reduction technique used by the reduction matrix 440. The sliced control 446 is used to represent a logical operation.

In one or more embodiments, the sliced control 446 may be indicative of a delimitation of a portion of the serialized data stream, depending on the type of serialization format, however, this does not need to be so in each and every embodiment of the present technology.

In one or more embodiments, the sliced control 446 may be a reference to a reduction method that needs to be injected by the reduction matrix 440 based on the data type. Thus, during decoding, the sliced control 446 may indicate that there is a given data type, and that a corresponding appropriate method must be used to read the given data type. It will be appreciated that this appropriate method may be referenced in the outgoing data stream, such that it can be read during the unpacking and reconstruction procedure by a decoding matrix corresponding, which would update itself with this method and apply the method to decode the data associated with the given data type during decoding.

As a non-limiting example, for the JSON language, the sliced control 446 may be a structural token in JSON (i.e., defining an object, array or string) and a control character in a string in JSON e.g. "[", "]", "{", "}", ":", ",".

In the context of the present technology, sliced controls are processed using an overflow technique. The overflow technique is used to encode handling operations metadata by leveraging unused ids so as to map operations on a predefined table. Overflow techniques use empty indexes numbers (for the same number of bits as the current index) to reduce the number of bits required to encode control values. It will be appreciated that the predefined table is dependent on the serialized data language.

TABLE 3 provides a sample overflow technique for data serialized in JSON to optionally encode handling operations metadata by using an offset/overflow technique to leverage the potential plurality of unused ids to map operations on a predefined table.

TABLE 3

| SOLO CONTROL (on empty index) | OFFSET TO INDEX LIMIT (to last id) | OPERATION | |
|---|---|---|---|
| 0 | +1 | Add string | Value |
| 1 | +2 | Add numeral | Value |
| 2 | +3 | Add key | Value |
| 3 | +4 | Begin object | Control |
| 4 | +5 | End object | Control |
| 5 | +6 | Add literal | Value |
| 6 | +7 | Start Array | Control |
| 7 | +8 | End Array | Control |

If the offset cannot be contained in the currently available number of bits, the maximum value is assigned as key id and the additional overflowing offset is encoded on the minimum number bits that could contain the delta between the current index position and the last element on the operation table.

Figure 6:
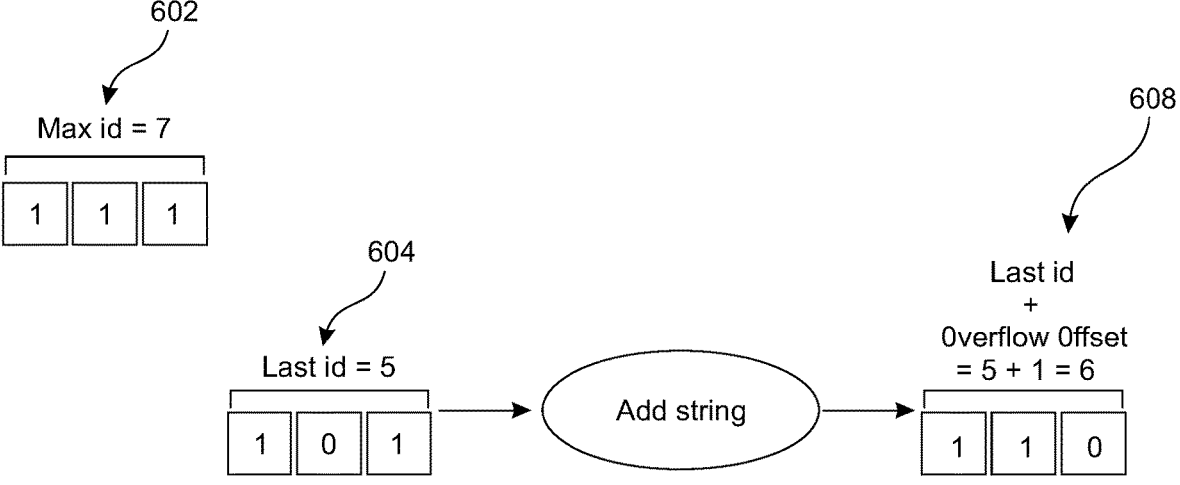
FIG. 6 and FIG. 7 depict examples of overflow offsets in accordance with one or more non-limiting embodiments of the present technology.

As a non-limiting example, as illustrated in FIG. 6, if the last id+overflow offset: (i) can be contained in the same number of bits as last id; (ii) is not the max id that can be contained in this number of bits, the sum may be passed as the index id. In FIG. 6, the max id 602 is equal to 7 (111 in binary representation), and the last id 604 is equal to 5 (101 in binary representation). The add string operation (represented in Table 3 above) adds a +1 offset to the last id, resulting in a list if and overflow offset 608 of 5 (last id)+1 (add string operation)=6 (101 in binary representation).

Figure 7:
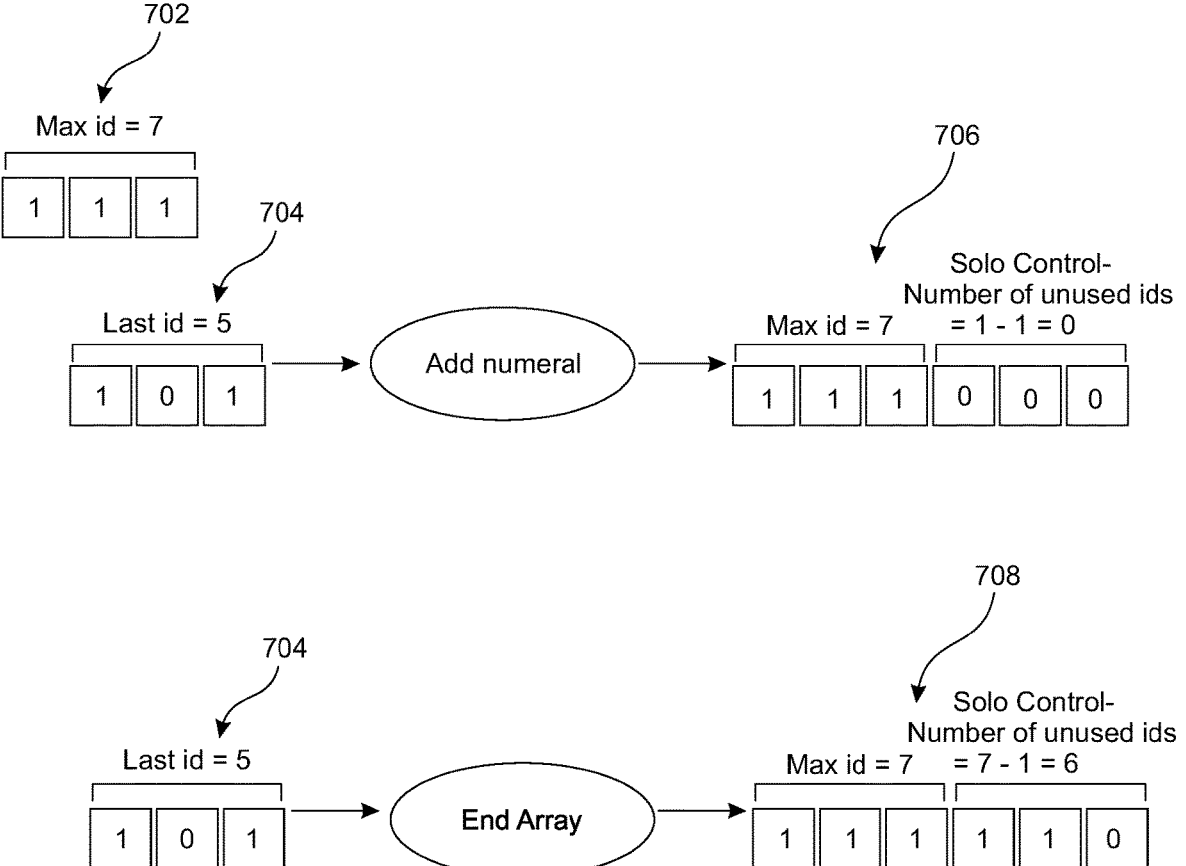

As another non-limiting example, as illustrated in FIG. 7, if last id+overflow offset is greater or equal to the max id: (i) the max id and the solo control–number of unused ids is the minimum number of bits that can contain max solo offset–number of unused ids). In FIG. 7, the max id 702 is equal to 7, and the last id (101 in binary representation) is equal to 5 (101 in binary representation).

The add numeral operation (represented in Table 3 above) adds a solo control of 1 on an empty index, thus resulting in a max id of 7 (111 in binary representation) and a solo control (number of unused ids) of 1–1=0 (000 in binary representation). In the case of the add array operation (represented in Table 3 above), the max id is 7 and the solo control for end array (number of unused ids) is equal to 7–1=6 (110 in binary representation)

TABLE 4 provides a sample of a string bit packing overflow table with a sample UTF-8 string technique.

TABLE 4

String Bit Packing Overflow Table

| Index overflow (on empty index) | Index overflow (to last id) | Operation | |
|---|---|---|---|
| 0 | +1 | Add 7 bits character | VALUE |
| 1 | +2 | End string | CONTROL |
| 2 | +3 | Add 11 bits character | VALUE |
| 3 | +4 | Add 16/21 bits character | VALUE |

It should be noted that 16/21 bits characters are preceded by a bit to quantify their length (0 for 16 bits characters and 1 for 21 bit characters).

TABLE 5 is the character value encoded in significative bits for the UTF-8 binary format:

TABLE 5

Sample UTF-8 String Technique

| Character range | UTF-8 Binary format | Number of bits (UTF-8) | Significative bits |
|---|---|---|---|
| 0-127 | 0xxxxxxx | 8 | 7 |
| 128-2047 | 110xxxxx 10xxxxxx | 16 | 11 |
| 2048-65535 | 1110xxxx 10xxxxxx | 24 | 16 |
| 65526-1114111 | 11110xxx 10xxxxxx | 32 | 21 |

TABLE 6 provides a sample numeral technique to optionally encode JSON numerals by leveraging the limited character set in each number parts as per the rfc 7159 standard.

TABLE 6

Bit Packing - Sample Numeral Technique

| Numeral Part | Possible character set (as per rfc 7159) |
|---|---|
| Integer | 0, 1, 2, 3, 4, 5, 6, 7, 8, 9, ., e, E, – |
| Fraction | 0, 1, 2, 3, 4, 5, 6, 7, 8, 9, e, E and – (not in rfc, only as part ender) |
| Scientific | 0, 1, 2, 3, 4, 5, 6, 7, 8, 9, + and – |

Using this technique, up to 7 characters are indexed to keep most references contained under 3-bits; leaving the 8th position open as an escape reference to the sorted list of unindexed characters.

As another non-limiting example, the following code represents a JSON object comprising an "ID list" object and a "Properties" object.

```
{
    "ID list":
    [
        "bdf69a7522180635cfbbc5feb5949be7",
        "50f7270061e7b74955339d09faf027cf",
        "cd2c936369294d6b12778469fc307e12",
        "e4b6b4ebc4c243a92d989febf09440c2",
        "d36b36197574c2d7211740b1ce2b5447"
    ],
    "Properties":
    {
        "bdf69a7522180635cfbbc5feb5949be7":   {
            "active":   0,
            "links":                                            [
"cd2c936369294d6b12778469fc307e12",
"50f7270061e7b74955339d09faf027cf"]] } ,
            "50f7270061e7b74955339d09faf027cf":             {
        "active":                   1,                  "links":
["bdf69a7522180635cfbbc5feb5949be7"]] } ,
            "cd2c936369294d6b12778469fc307e12":             {
        "active":               1,              "links":
["bdf69a7522180635cfbbc5feb5949be7"]] },
            "e4b6b4 ebc4c243a92d989febf09440c2":             {
        "active":   1,   "links":        [ ] },
            "d36b36197574c2d7211740b1ce2b5447":             { 
        "active":   1,   "links":        [ ] }
        }
    }
}
```

FIG. 8 also illustrates the above JSON object comprising two objects. The first object has an "ID list" key 604 and as a value an array 606, where the array 606 includes five different MD5 hashes. The second object 624 has a "Properties" key and as a value five objects 626, where each of the five objects has a key that refers to a respective MD5 hash in the ID list. Each of the five objects comprises two respective objects: a first respective object key "active" with a respective value, and a second respective object key "links" is an array of size 2.

In this example, the MD5 hash context may be detected by the reduction matrix 440 based on the following example condition: if a string has 32 characters and has more than 4 switches from alphabetic to numeral, it is assumed to be a MD5 hash. The MD5 hash may be referenced by using 3 bits (due to the size of the index+1=6, which is smaller than a size of 8 (3-bits)). Thus, in this example, 3 bits are used to represent a MD5 hash instead of 256 bits, which corresponds to a reduction ratio of 85:1.

Bit Packed Data Aggregator

The bit packed data aggregator 470 is configured to aggregate all the bit packed sliced values (i.e., including the given bit packed sliced value 462 and/or the another given bit packed sliced value 466 having been generated at different iterations while processing the plurality of data blocks 430) to obtain and transmit an outgoing bit packed data stream 474.

It will be appreciated that the index is not present in the outgoing bit packed data stream 474, however the bit packed data stream 474 contains all information required to regenerate the index dynamically. The size of the dynamically reconstructed index (which grows during the reconstruction process) is used to determine how many bits need to be read to reconstruct the serialized data stream.

In one or more embodiments, the outgoing bit packed data stream 474 is transmitted over the communication network 240 of FIG. 2 (e.g., the internet 340 in FIG. 3).

In one or more other embodiments, the outgoing bit packed data stream 474 may be transmitted to another processor operatively connected to the processor executing the data reduction and packing procedure 400, i.e., to another component within the same enclosure.

It will be appreciated that the bit packed data stream 474 is decoded by the receiving computing device (e.g., given one of the plurality of client devices 210). The receiving computing device may decode the bit packed data stream 474 by dynamically reconstructing the index, where the number of bits to be read by the receiving device to reconstruct the serialized data stream may be determined based on the current index size. The decompression of the bit packed data stream 474 may be performed by using the reverse of the data reduction and packing procedure 400 (i.e., a data unpacking and reconstruction procedure) by verifying conditions and updating the method for the given context or for the given type in a global manner. The decompression includes reading n bits (representing the number of elements+1 for the current context). If the id is present in the index, the reconstruction procedure writes the value in the decompressed data stream values, and if the id is not present in the current index context, the reconstruction procedure reads the value according to the conditions associated with the reduction technique for the current index context and writes the value to the index context and/or the decompressed data stream values. The reconstruction procedure verifies conditions and updates the reverse reduction technique for the context or for the data type in a global manner.

TABLE 7 below provides test results on 47 public APIs of one or more embodiments of the present technology implemented in the PYTHON programming language:

TABLE 7

Test results for 47 public APIs

| | Median | Mean |
|---|---|---|
| First Transfer (47 files) | | |
| Packing time: | 0.1394 seconds | 1.762 seconds |
| Unpacking time: | 0.1525 seconds | 2.032 seconds |
| Original size: | 86084 bytes | 1884057 bytes |
| Packed size: | 32823 bytes | 450818 bytes |
| Data accuracy: | 100.0% | 100.0% |
| Reduction rate | 2.935 X | 3.711 X |
| Maximum reduction rate | 15.2 x | |
| Subsequent transfer in same session - index reuse (287 files) | | |
| Packing time: | 0.04788 seconds | 0.8876 seconds |
| Unpacking time: | 0.04772 seconds | 1.073 seconds |
| Original size: | 66080 bytes | 2395483 bytes |
| Packed size: | 9270 bytes | 216971 bytes |
| Data accuracy: | 100.0% | 100.0% |
| Reduction rate | 11.48 X | 12.99 X |
| Maximum reduction rate | 42.03 X | |

It will be appreciated that the processing speed depends on the programming language used and code implementation. The developer of the present technology has also implemented the present technology in the RUST programming language, which enables obtaining processing speeds of 60-150 Mb/s (as opposed to 1-5 Mb/s in PYTHON).

Figure 9:
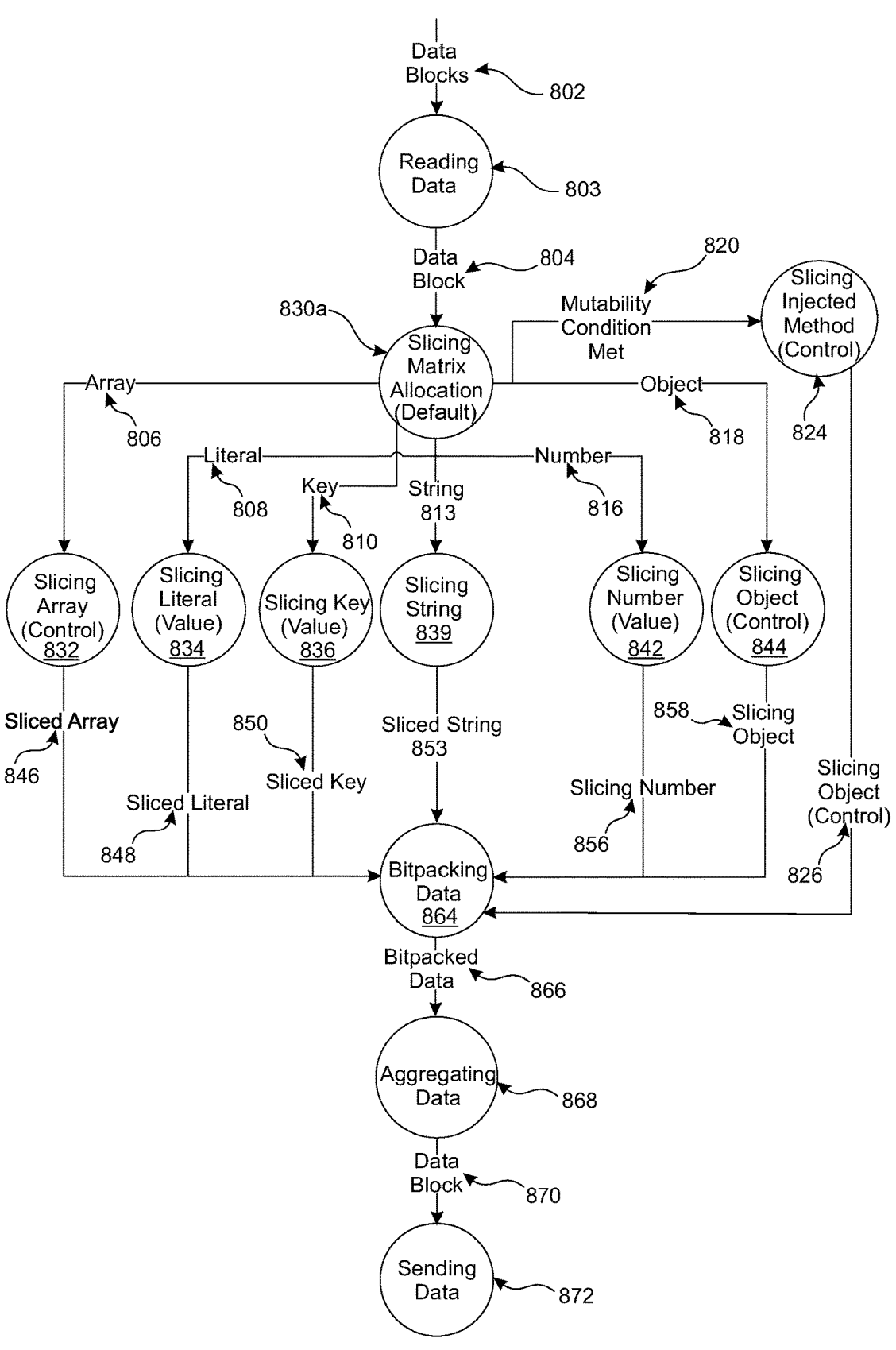
FIG. 9 illustrates a finite state diagram of a data reduction and packing procedure in a default state in accordance with one or more non-limiting embodiments of the present technology.

FIG. 9 illustrates a finite state diagram 800 of a data reduction and packing procedure in a default state in accordance with one or more non-limiting embodiments of the present technology.

Figure 10:
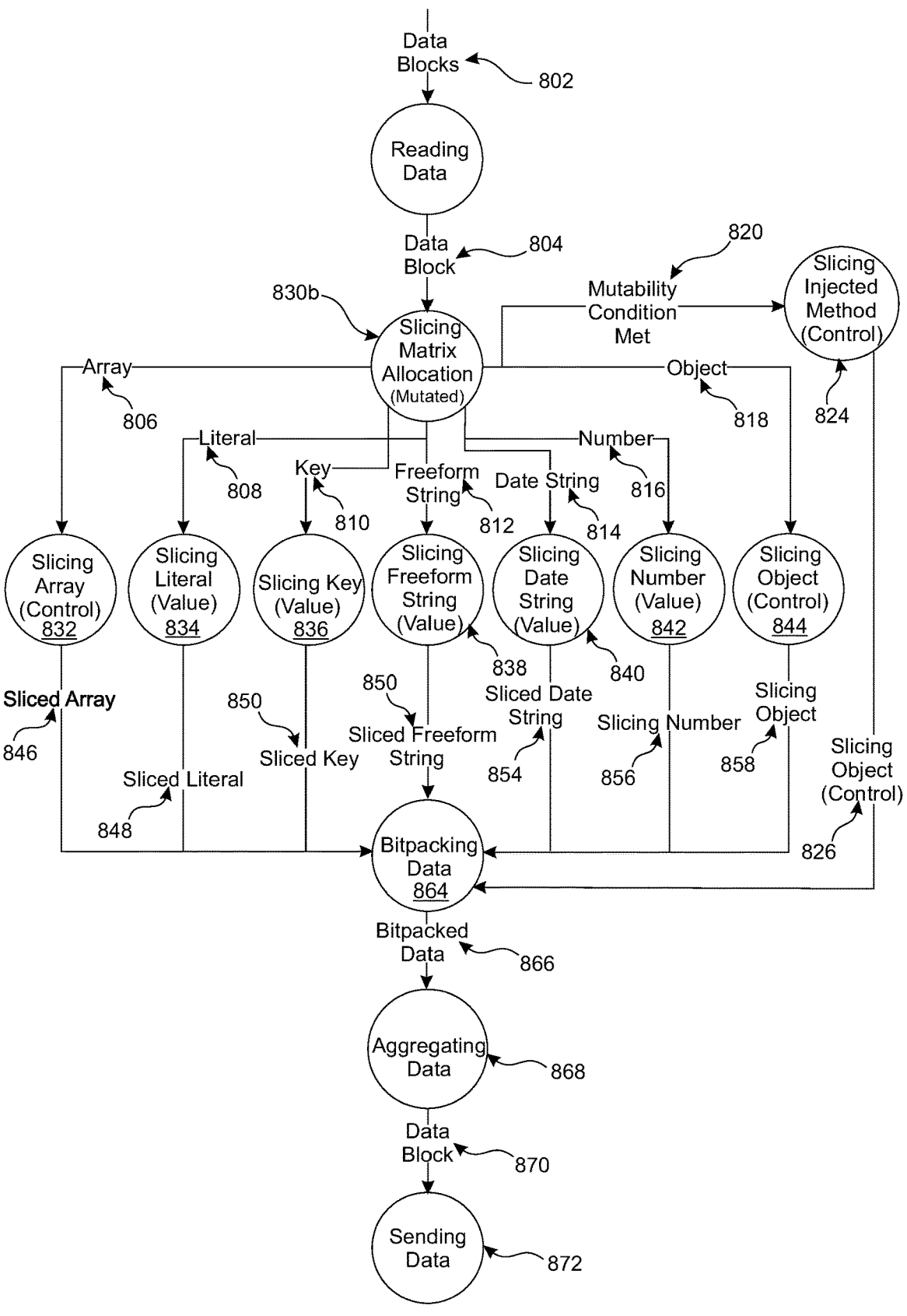
FIG. 10 illustrates a finite state diagram of the data reduction and packing procedure of FIG. 9 in a mutated state in accordance with one or more non-limiting embodiments of the present technology.

FIG. 10 illustrates the finite state diagram of the data reduction and packing procedure of FIG. 9 in a mutated state. The same reference numerals are assigned to the same states in FIG. 9.

In one or more embodiments, the finite state diagram 800 represents the data reduction and packing procedure 400 of FIG. 4. The finite state diagram 800 represents the transitions of a reduction matrix 830 (similar to the reduction matrix 440). The states of the reduction matrix 830 are represented by the slicing array state 832, the slicing literal 834 state, the slicing key 836 state, the slicing freeform string 838 state, the slicing date string state 840, the slicing number state 842, and the slicing object state 844

The input serialized data blocks 802 are received by a reader which reads data 803 to output a data block 804.

The reduction matrix 830 receives the data block 804 and obtains one of: an array 806, a literal 808, a key 810, a number 816, and an object 818.

When a mutability condition 820 is met (FIG. 10), the reduction matrix 830 may obtain one of: an array 806, a literal 808, a key 810, a freeform string 812, a date string 814, a number 816, and an object 818, The array 806 changes the state of the reduction matrix 830 to slicing array state 832 to output a sliced array 846.

The literal 808 changes the state of the reduction matrix 830 to slicing literal state 834 to output a sliced literal 848.

The key 810 changes the state of the reduction matrix 830 to slicing key state 836 to output a sliced key 850.

When a mutability condition is met 820, the default state of the reduction matrix 830a (FIG. 9) is changed to a mutated state 830b (FIG. 10).

When a mutability condition 820 is met (FIG. 10), the freeform string 812 changes the state of the reduction matrix 830 to slicing freeform string state 838 to output a sliced freeform string 852.

When a mutability condition 820 is met (FIG. 10), the date string 814 changes the state of the reduction matrix 830 to slicing date string state 840 to output a sliced date string 854.

The number 816 changes the state of the reduction matrix 830 to slicing number state 842 to output a sliced number 856.

The object 818 changes the state of the reduction matrix 830 to slicing object state 844 to output a sliced object 858.

The bit packer 864 receives as an input on the sliced array 846, the sliced literal 848, the sliced key 850, the sliced freeform string 852, the sliced date string 854, the sliced number 856, and the sliced object 858 and outputs bit packed data 866.

The aggregator 868 receives the bit packed data 866 and outputs the outgoing data block 840.

The sender 872 sends the outgoing data block 840.
Method Description

Figure 11:
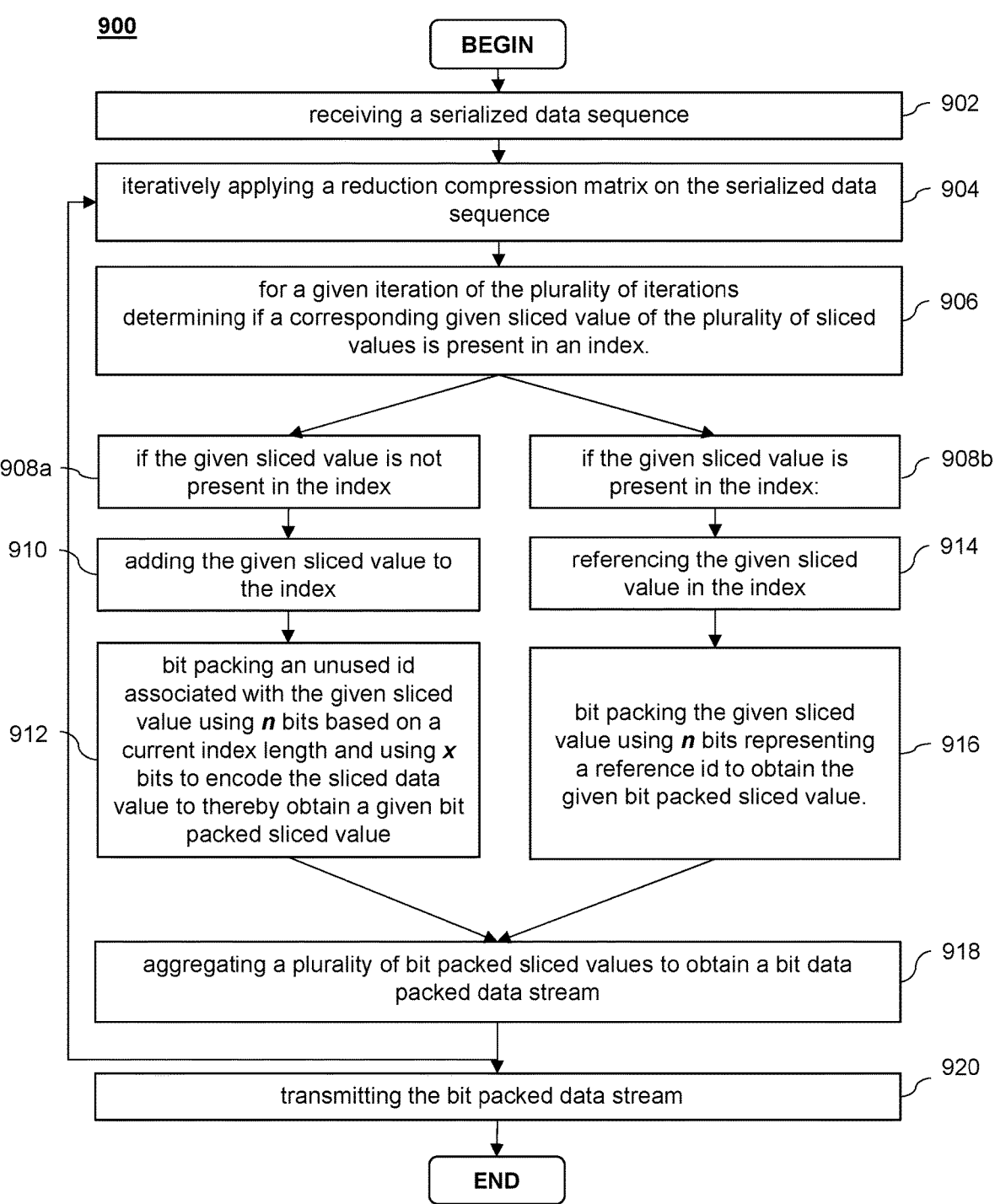
FIG. 11 illustrates a flow chart of a method of dynamic adaptive slicing and reduction of serialized data in accordance with one or more non-limiting embodiments of the present technology.

FIG. 11 depicts a flowchart of a data reduction and bit packing method 900 in accordance with one or more non-limiting embodiments of the present technology.

In one or more embodiments, the server 220 comprises a processor such as the processor 110 and/or the GPU 111 operatively connected to a non-transitory computer readable storage medium such as the solid-state drive 120 and/or the random-access memory 130 storing computer-readable instructions. The processor, upon executing the computer-readable instructions, is configured to or operable to execute the method 900.

The method 900 is executed for a current session where serialized data sequence is streamed, and where there is no a priori knowledge of when the serialized data sequence ends.

According to processing step 902, the processor receives a serialized data sequence. In one or more embodiments, the serialized data sequence is a serialized data stream 410. The serialized data sequence is a byte representation of a plurality of serialized data objects comprising the object's data, information about the object's type, types of data stored in the object and additional metadata. It will be appreciated that serialized objects may be nested within other serialized objects in the serialized data sequence.

The serialized data sequence is streamed (i.e., made available over time) and the plurality of serialized data objects are processed one at a time. As a non-limiting example, the serialized data sequence may include one or more JSON files having the plurality of serialized objects. The method 900 is executed until the current session ends (i.e., end of the data stream) or is interrupted (e.g., loss of communication).

In one or more embodiments, the serialized data sequence is obtained in response to a request from a client device such as one of the plurality of client devices 210. In one or more other embodiments, the serialized data sequence is obtained from another component within the same enclosure as the processor.

In one or more embodiments, the serialized data sequence is separated into a plurality of serialized data blocks 430. Each of the plurality of serialized data blocks 430 has a predetermined size. It will be appreciated that that the serialized data blocks are generated one at a time as the serialized data sequence is received by the processor.

According to processing step 904, the processor iteratively applies a reduction matrix 440 on each of the serialized data sequence to obtain a plurality of sliced values. It will be appreciated that since the serialized data sequence is streamed, the number of iterations is not known in advance, and processing step 904 is applied continuously on the serialized data sequence as it is received.

In one or more embodiments, prior to processing step 904, the processor initializes the reduction matrix 440 by retrieving the reduction matrix 440 from a non-transitory storage medium operatively connected to the processor.

In one or more embodiments, the reduction matrix 440 is a mutable reduction matrix (i.e., 2D array) comprising a set of predefined conditions based on the serialized data type and/or format. Each predefined condition is associated with one or more slicing and reduction techniques. The reduction matrix 440 functions through dynamic injection of "in memory" mutable processes, which can be injected at any time whenever some conditions are met while processing the serialized data.

The processor initializes an index in memory. In one or more embodiments the index is represented using one of. HashMaps, vectors, and arrays.

The reduction matrix 440 is applied continuously on the plurality of serialized data blocks 430 until all elements present in the plurality of serialized data blocks 430 have been processed by the reduction matrix 440. Slicing of the data reduces the index size, thereby reducing the number of bits needed to represent its reference ids. It will be appreciated that the number of bits do not need to be referenced.

In one or more embodiments, the reduction matrix 440 is defined for an object (corresponding to a control in the index), a number (corresponding to a value in the index), a string (corresponding to a value in the index), a key (corresponding to a value in the index), a literal (corresponding to a value in the index), and an array (corresponding to a value in the index). Additionally, the reduction matrix 440 may be defined for a date string (corresponding to a value in the index) and a freeform string (corresponding to a value in the index). For an object, the reduction matrix 440 obtains a sliced object, for a number the reduction matrix 440 obtains a sliced number, for a string the reduction matrix 440 obtains a sliced string, for a key the reduction matrix 440 obtains a sliced key, for a literal the reduction matrix 440 obtains a sliced literal, and for an array the reduction matrix 440 obtains a sliced array.

According to processing step 906, for a given iteration of the plurality of iterations, the processor determines, via the reduction matrix 440, if a corresponding given sliced value of the plurality of sliced values is present in an index. The processor proceeds to either processing step 908*a* or processing step 908*b*.

According to processing step 908*a*, if the processor determines the given sliced value 444 is not present in the index, the processor proceeds to processing step 910.

According to processing step 910, the processor adds the given sliced value to the index and proceeds to processing step 912.

According to processing step 912, the processor bit packs an unused id associated with the given sliced value 444 by using a first number of bits based on a current index length and using a second number of bits to encode the sliced data value to obtain a given bit packed sliced value.

According to processing step 908*b*, if the processor determines that the given sliced value 444 is present in the index, the processor proceeds to processing step 914.

According to processing step 914, when the given sliced value is present in the index, the processor references the given sliced value 444 in the index and proceeds to processing step 916.

According to processing step 916, the processor bit packs the given sliced value using a third number of bits representing a reference id to obtain the given bit packed sliced value.

The processor continuously applies steps 904-918 when encountering a sliced value.

In one or more embodiments, after executing processing step 904, for a given iteration, the processor obtains a sliced object 442.

In one or more embodiments, after executing processing step 904, for a given iteration, the processor obtains a sliced array 448.

According to processing step 918, the processor aggregates a plurality of bit packed sliced values to obtain a bit data packed data sequence, the plurality of bit packed sliced values comprising the given bit packed sliced value obtained at a given iteration.

In one or more embodiments, after the mutable reduction matrix 100 has been applied, the processor performs aggregation of the bit packed sliced values (i.e., each resulting from a corresponding iteration) to add the bit packed sliced value to the bit backet data sequence in the form of the bit packed data stream 474. The bit packed data stream 474 contains all information required to reconstruct the serialized data sequence. The bit packed data stream 474 enables dynamically reconstructing the index (which grows during the reconstruction process) where its size is used to determine how many bits need to be read to obtain the serialized data sequence. Thus, the index is not transmitted separately from the bit packed data stream 474 but information required to reconstruct it is present therein.

According to processing step 920, the processor transmits the bit packed data sequence in the form of a bit packed data stream 474. The bit packed data sequence is generated and transmitted sequentially and continuously as a stream, i.e., processing steps 904-920 are executed as long as a serialized data sequence is received by the processor at processing step 902.

In one or more embodiments, the processor transmits the bit packed data stream 474 over the communication network 240. In one or more other embodiments, the processor transmits the bit packed data stream 474 to another component operatively connected thereto.

It will be appreciated that the processor does not transmit the serialized data stream, but instead transmits the bit packed data stream 474, which contains all information required to reconstruct the data represented in the serialized data stream on the requesting device. The bit packed data stream 474 is read and used to reconstruct the serialized data sequence sequentially.

In one or more other embodiments, the processor transmits the bit packed data stream to another processor within the same enclosure as the processor executing method 900. In one or more alternative embodiments, the processor stores the bit packed data stream 474 in a non-transitory storage medium, where the bit packed serialized data may be unpacked and reconstructed upon retrieval.

The method 900 ends.

In one or more embodiments, the method 900 ends for the current session when the serialized data sequence ends, or if there is an interruption in the receipt of the serialized data (e.g., due to malfunction of components/communication). The method 900 is applied in real-time as the serialized data is being received in a stream, and does not require a priori knowledge of the complete structure of the serialized data objects in the serialized data sequence.

One or more embodiments of the present technology operate on the transmission channel, and may be adapted and used between components of a computing device, a router, NVMe disk drivers, between IoT devices, a Docker or Kubernetes container, a mobile app service, a NoSQL database engine, a cloud service, and the like.

It should be expressly understood that not all technical effects mentioned herein need to be enjoyed in each and every embodiment of the present technology. For example, embodiments of the present technology may be implemented without the user enjoying some of these technical effects, while other non-limiting embodiments may be implemented with the user enjoying other technical effects or none at all.

Some of these steps and signal sending-receiving are well known in the art and, as such, have been omitted in certain portions of this description for the sake of simplicity. The signals can be sent-received using optical means (such as a fiber-optic connection), electronic means (such as using wired or wireless connection), and mechanical means (such as pressure-based, temperature based or any other suitable physical parameter based).

Modifications and improvements to the above-described implementations of the present technology may become apparent to those skilled in the art. The foregoing description is intended to be exemplary rather than limiting.

The invention claimed is:

1. A method for dynamically and adaptively reducing a streamed serialized data sequence to obtain a bit packed data stream, the method being executed by at least one processor, the method comprising:

receiving a streamed serialized data sequence comprising a plurality of serialized data objects each having a serialized object data type;

iteratively applying a reduction matrix on the streamed serialized data sequence to obtain a plurality of sliced values based at least on the serialized object data types, said iteratively applying comprising:

initializing an index; and for a given iteration:

determining if a corresponding given sliced value of the plurality of sliced values is present in an index;

if the given sliced value is not present in the index:

adding the given sliced value to the index, the adding comprising:

bit packing an unused id associated with the given sliced value using a first number of bits based on a current index length and using a second number of bits to encode the given sliced value to thereby obtain a given bit packed sliced value;

aggregating a plurality of bit packed sliced values to obtain a bit packed data stream, the plurality of bit packed sliced values comprising the given bit packed sliced value; and transmitting the bit packed data stream, the bit packed data stream comprising an indication of the index and the given sliced value.

2. The method of claim 1, further comprising, prior to said aggregating the plurality of bit packed sliced values to obtain the bit packed data stream:

if the given sliced value is present in the index:

referencing the given sliced value, the referencing comprising:

bit packing the given sliced value using a third number of bits representing a reference id to obtain the given bit packed sliced value.

3. The method of claim 2, wherein said iteratively applying the reduction matrix on the streamed serialized data sequence to obtain the plurality of sliced values comprises:

obtaining a given sliced object;

determining a respective index context based on one of: a position, and a key associated with the given sliced object; and passing the one of the position and the key as the sliced value.

4. The method of claim 3, wherein said passing the key as the sliced value comprises passing a sequence of characters representing the key as the sliced value.

5. The method of claim 1, wherein said iteratively applying the reduction matrix on the streamed serialized data sequence to obtain the plurality of sliced values comprises:

determining a current respective index context, the current respective index context being based at least on a format of the streamed serialized data sequence.

6. The method of claim 1, wherein said iteratively applying the reduction matrix on the streamed serialized data sequence to obtain the plurality of sliced values comprises:

iteratively applying the reduction matrix on the sliced object to obtain another given sliced value, the another given sliced value being associated with a current respective index context.

7. The method of claim 1, wherein said iteratively applying the reduction matrix on the streamed serialized data sequence to obtain the plurality of sliced values further comprises obtaining a given sliced control, the given sliced control not being associated with a value in the serialized data sequence, the given sliced control being processed using an overflow technique.

8. The method of claim 1, further comprising encoding handling operations metadata based on a predetermined table, the predetermined table comprising, for each respective data type and each respective control: a respective index offset to the last id, and a solo control on an empty index.

9. The method of claim 1, wherein said iteratively applying the reduction matrix on the streamed serialized data sequence to obtain the plurality of sliced values comprises: obtaining a given sliced array; and iteratively applying the reduction matrix on the streamed serialized data sequence to obtain a further sliced value.

10. The method of claim 9, further comprising, after said obtaining the given sliced array: determining, based on the given sliced array, a respective index context.

11. The method of claim 1, wherein the reduction matrix is implemented as a mutable reduction matrix.

12. A system for dynamically and adaptively reducing a streamed serialized data sequence to obtain a bit packed data stream, the system comprising:

at least one processor; and a non-transitory storage medium operatively connected to the at least one processor, the non-transitory storage medium comprising computer-readable instructions;

wherein the at least one processor, upon executing the computer-readable instructions, is configured for:

receiving a streamed serialized data sequence comprising a plurality of serialized data objects each having a serialized object data type;

iteratively applying a reduction matrix on the streamed serialized data sequence to obtain a plurality of sliced values based at least on the serialized object data types, said iteratively applying comprising:

initializing an index; and for a given iteration:

determining if a corresponding given sliced value of the plurality of sliced values is present in an index;

if the given sliced value is not present in the index:

adding the given sliced value to the index, the adding comprising:

bit packing an unused id associated with the given sliced value using a first number of bits based on a current index length and using a second number of bits to encode the given sliced value to thereby obtain a given bit packed sliced value;

aggregating a plurality of bit packed sliced values to obtain a bit packed data stream, the plurality of bit packed sliced values comprising the given bit packed sliced value; and transmitting the bit packed data stream, the bit packed data stream comprising an indication of the index and the given sliced value.

13. The system of claim 12, wherein the at least one processor is further configured for, prior to said aggregating the plurality of bit packed sliced values to obtain the bit packed data stream:

if the given sliced value is present in the index:

referencing the given sliced value, the referencing comprising:

bit packing the given sliced value using a third number of bits representing a reference id to obtain the given bit packed sliced value.

14. The system of claim 13, wherein said iteratively applying the reduction matrix on the streamed serialized data sequence to obtain the plurality of sliced values comprises:

obtaining a given sliced object;

determining a respective index context based on one of: a key and a position associated with the given sliced object; and passing the one of the key and the position as the sliced value.

15. The system of claim 14, wherein said passing the key as the sliced value comprises passing a sequence of characters representing the key as the sliced value.

16. The system of claim 12, wherein said iteratively applying the reduction matrix on the streamed serialized data sequence to obtain the plurality of sliced values comprises:

determining a current respective index context, the current respective index context being based at least on a format of the streamed serialized data sequence.

17. The system of claim 12, wherein said iteratively applying the reduction matrix on the streamed serialized data sequence to obtain the plurality of sliced values comprises:

iteratively applying the reduction matrix on the sliced object to obtain another given sliced value, the another given sliced value being associated with a current respective index context.

18. The system of claim 12, wherein said iteratively applying the reduction matrix on the streamed serialized data sequence to obtain the plurality of sliced values further comprises obtaining a given sliced control, the given sliced control not being associated with a value in the streamed serialized data sequence, the given sliced control being processed using an overflow technique.

19. The system of claim 12, wherein the at least one processor is further configured for encoding handling operations metadata based on a predetermined table, the predetermined table comprising, for each respective data type and each respective control: a respective index offset to the last id and a solo control on an empty index.

20. The system of claim 12, wherein said iteratively applying the reduction matrix on the streamed serialized data sequence to obtain the plurality of sliced values comprises: obtaining a given sliced array; and iteratively applying the reduction matrix on the streamed serialized data sequence to obtain a further sliced value.

21. The system of claim 20, wherein the at least one processor is further configured for, after said obtaining the given sliced array: determining, based on the given sliced array, a respective index context.

22. The system of claim 12, wherein the reduction matrix is implemented as a mutable reduction matrix.

\* \* \* \* \*